US009852783B1

(12) United States Patent
Na et al.

(10) Patent No.: US 9,852,783 B1
(45) Date of Patent: Dec. 26, 2017

(54) METAL-OXIDE SEMICONDUCTOR (MOS) TRANSISTOR OFFSET-CANCELLING (OC), ZERO-SENSING (ZS) DEAD ZONE, CURRENT-LATCHED SENSE AMPLIFIERS (SAS) (CLSAS) (OCZS-SAS) FOR SENSING DIFFERENTIAL VOLTAGES

(71) Applicants: QUALCOMM TECHNOLOGIES, Inc., San Diego, CA (US); Industry-Academic Cooperation Foundation, Yonsei University, Seoul (KR)

(72) Inventors: Taehui Na, Seoul (KR); Byung Kyu Song, Seoul (KR); Seong-Ook Jung, Seoul (KR); Jung Pill Kim, San Diego, CA (US); Seung Hyuk Kang, San Diego, CA (US)

(73) Assignees: QUALCOMM Technologies, Inc., San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/274,034

(22) Filed: Sep. 23, 2016

(51) Int. Cl.
*G11C 11/16* (2006.01)

(52) U.S. Cl.
CPC ........ *G11C 11/1673* (2013.01); *G11C 11/161* (2013.01); *G11C 11/1697* (2013.01)

(58) Field of Classification Search
CPC .................................................. G11C 11/1673
(Continued)

(56) References Cited

U.S. PATENT DOCUMENTS 5,424,990 A * 6/1995 Ohsawa ................. G11C 29/50
  365/201
6,590,805 B2 7/2003 Lu et al.
(Continued)

OTHER PUBLICATIONS

Na, Taehui et al., "A Double-Sensing-Margin Offset-Canceling Dual-Stage Sensing Circuit for Resistive Nonvolatile Memory," IEEE Transactions on Circuits and Systems—II: Express Briefs, vol. 62, No. 12, Dec. 2015, pp. 1109-1113.
(Continued)

*Primary Examiner* — Min A Huang
(74) *Attorney, Agent, or Firm* — Withrow & Terranova, PLLC

(57) ABSTRACT

Metal-oxide semiconductor (MOS) transistor offset-cancelling (OC), zero-sensing (ZS) dead zone, current-latched sense amplifiers (SAs) (CLSAs) (OCZS-SAs) for sensing differential voltages are provided. An OCZS-SA is configured to amplify received differential data and reference input voltages with a smaller sense amplifier offset voltage to provide larger sense margin between different storage states of memory bitcell(s). The OCZS-SA is configured to cancel out offset voltages of input and complement input transistors, and keep the input and complement input transistors in their activated state during sensing phases so that sensing is not performed in their "dead zones" when their gate-to-source voltage (Vgs) is below their respective threshold voltages. In other aspects, sense amplifier capacitors are configured to directly store the data and reference input voltages at gates of the input and complement input transistors during voltage capture phases to avoid additional layout area that would otherwise be consumed with additional sensing capacitor circuits.

30 Claims, 23 Drawing Sheets

(58) Field of Classification Search
USPC .......................................................... 365/158
See application file for complete search history.

(56) References Cited

U.S. PATENT DOCUMENTS

| | | | | |
|---|---|---|---|---|
| 6,803,794 | B2 | 10/2004 | Martin et al. | |
| 7,649,559 | B2* | 1/2010 | Olsen .................. | H04N 3/1512 |
| | | | | 327/491 |
| 8,233,342 | B2* | 7/2012 | Adams ................. | G11C 7/1096 |
| | | | | 365/189.16 |
| 9,111,623 | B1* | 8/2015 | Jung ................... | G11C 11/1673 |
| 9,165,630 | B2* | 10/2015 | Jung ........................ | G11C 7/06 |
| 2011/0215959 | A1* | 9/2011 | Matsuzawa ........... | H03K 5/2481 |
| | | | | 341/160 |
| 2012/0049947 | A1* | 3/2012 | Arsovski ................ | G01R 29/26 |
| | | | | 327/564 |
| 2015/0294706 | A1* | 10/2015 | Bonaccio ............ | G11C 11/1673 |
| | | | | 365/158 |
| 2015/0357021 | A1* | 12/2015 | Hush ................... | G11C 11/4091 |
| | | | | 365/72 |

OTHER PUBLICATIONS

Na, Taehui et al., "Comparative Study of Various Latch-Type Sense Amplifiers," IEEE Transactions on Very Large Scale Integration (VLSI) Systems, vol. 22, No. 2, Feb. 2014, pp. 425-429.

* cited by examiner

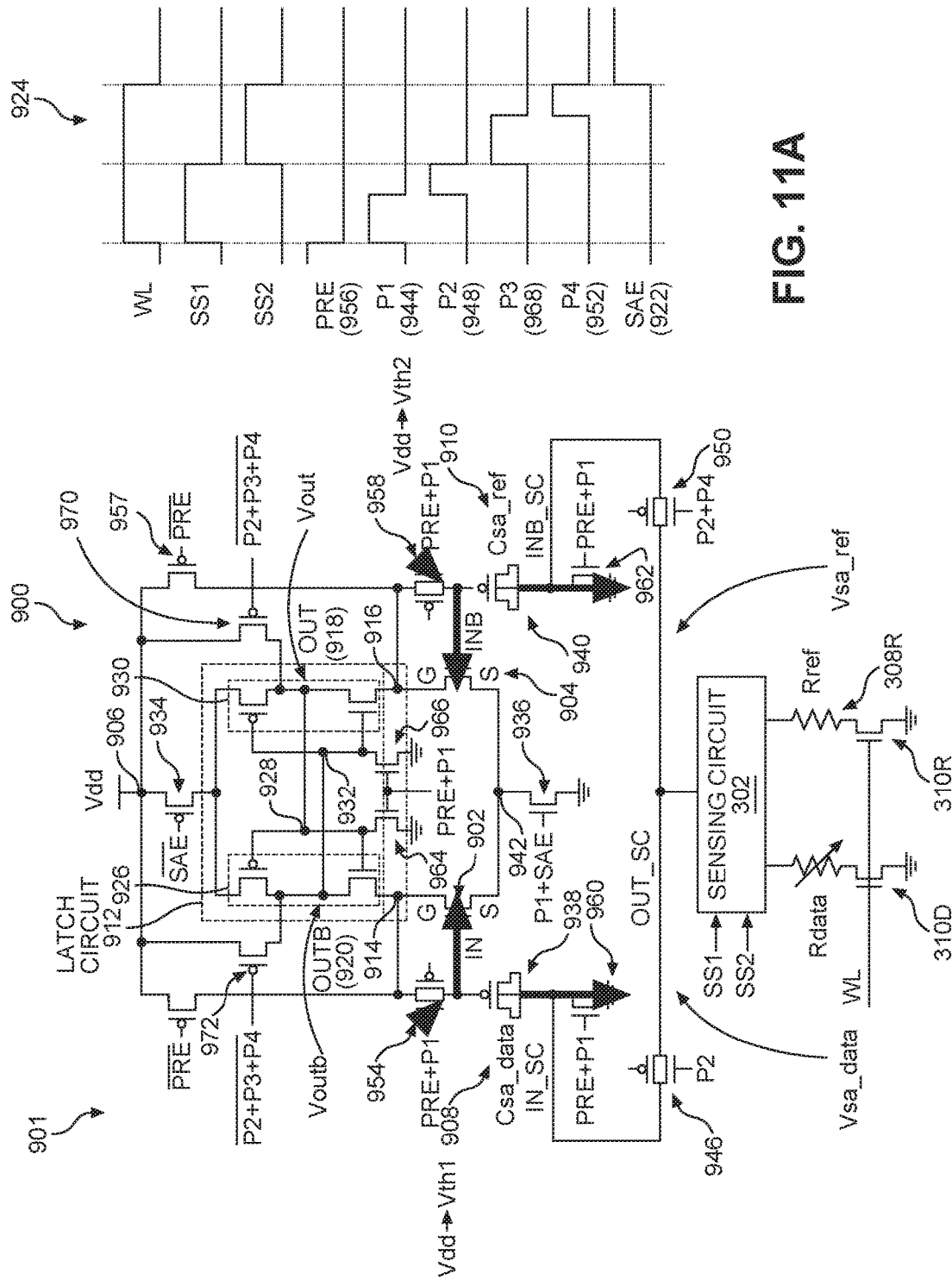

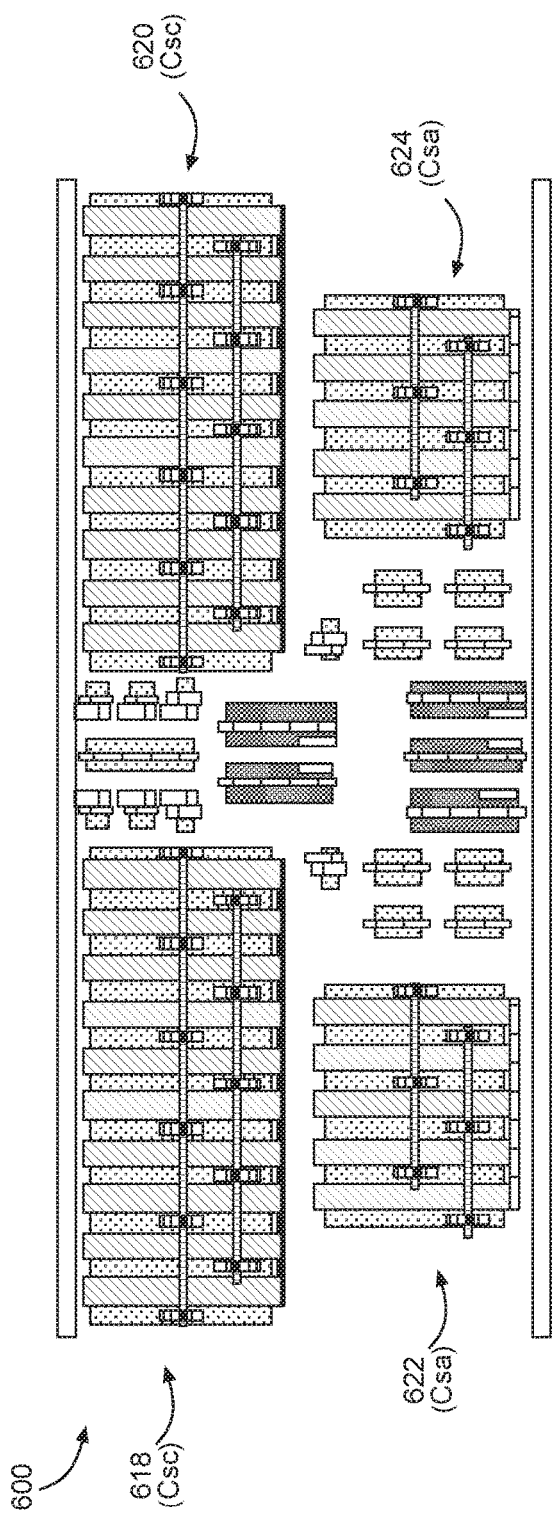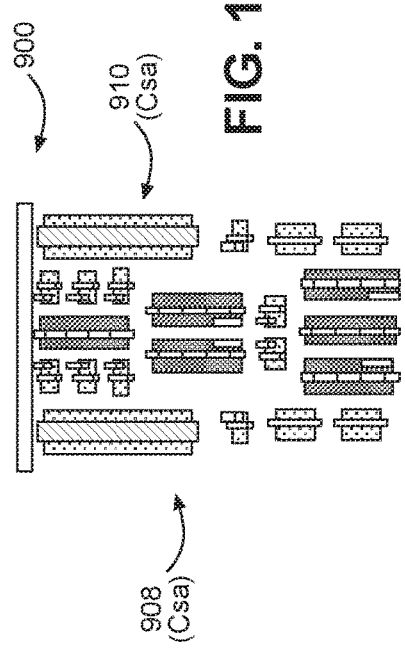
FIG. 13A
FIG. 13B

METAL-OXIDE SEMICONDUCTOR (MOS) TRANSISTOR OFFSET-CANCELLING (OC), ZERO-SENSING (ZS) DEAD ZONE, CURRENT-LATCHED SENSE AMPLIFIERS (SAS) (CLSAS) (OCZS-SAS) FOR SENSING DIFFERENTIAL VOLTAGES

BACKGROUND

I. Field of the Disclosure

The technology of the disclosure relates generally to magnetic random access memories (MRAMs) comprising MRAM bitcells for storing data as a function of magnetic polarization of magnetic tunnel junction (MTJ) storage elements, and more particularly to sensing circuitry for sensing storage states of MRAM bitcells as part of a read operation.

II. Background

Semiconductor storage devices are used in integrated circuits (ICs) in electronic devices to provide data storage. One example of a semiconductor storage device is magnetic random access memory (MRAM). MRAM is non-volatile memory in which data is stored by programming a magnetic tunnel junction (MTJ) as part of an MRAM bitcell. Unlike conventional random access memory (RAM) chip technologies, in MRAM, data is not stored as an electric charge, but is instead stored by magnetic polarization of storage elements. Thus, one advantage of an MRAM is that the MRAM bitcells can retain stored information even when power is turned off. The storage elements are formed from two ferromagnetic layers separated by a tunneling layer. One of the two ferromagnetic layers, which is referred to as a fixed layer or pinned layer, has a magnetization that is fixed in a particular direction. The other ferromagnetic magnetic layer, which is referred to as a free layer, has a magnetization direction that can be altered to represent either a "1" when the free layer magnetization is anti-parallel (AP) to the fixed layer magnetization, or "0" when the free layer magnetization is parallel (P) to the fixed layer magnetization or vice versa. One such device having a fixed layer, a tunneling layer, and a free layer is an MTJ. The electrical resistance of an MTJ depends on whether the free layer magnetization and fixed layer magnetization are parallel or anti-parallel to one another. Thus, an MRAM can be built from an array of individually addressable MTJs as resistive memory devices.

Recent developments in MTJ devices involve spin-transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an MTJ 100. The MTJ 100 is provided as part of an MRAM bitcell 102 to store non-volatile data. A metal-oxide semiconductor (typically n-type MOS, i.e., NMOS) access transistor 104 is provided to control reading and writing to the MTJ 100. A drain (D) of the access transistor 104 is coupled to a bottom electrode 106 of the MTJ 100, which is coupled to a pinned layer 108 having a fixed magnetization direction. A word line (WL) is coupled to a gate (G) of the access transistor 104. A source (S) of the access transistor 104 is coupled to a voltage source (Vs) through a source line (SL). The voltage source (Vs) provides a voltage (Vsl) on the source line (SL). A bit line (BL) is coupled to a top electrode 110 of the MTJ 100, which is coupled to a free layer 112 for example. The pinned layer 108 and the free layer 112 are separated by a tunnel barrier 114.

With continuing reference to FIG. 1, when writing data to the MRAM bitcell 102, the gate (G) of the access transistor 104 is activated by activating the word line (WL). A voltage differential between a voltage (Vbl) on the bit line (BL) and the voltage (Vsl) on the source line (SL) is applied. As a result, a write current (I) is generated between the drain (D) and the source (S) of the access transistor 104. If the magnetic orientation of the MTJ 100 is to be changed from AP to P, a write current ($I_{AP-P}$) flowing from the free layer 112 to the pinned layer 108 is generated. This induces an STT at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108. To read data from the MRAM bitcell 102, a read current is generated through the MTJ 100 via the same current path used to write data. If the magnetizations of the MTJ's 100 free layer 112 and pinned layer 108 are oriented parallel (P) to each other, the MTJ 100 presents a resistance that is different than the resistance the MTJ 100 would present if the magnetizations of the free layer 112 and the pinned layer 108 were in an anti-parallel (AP) orientation. The two different resistances represent a logic "0" and a logic "1" stored in the MTJ 100.

FIG. 2 is a circuit schematic illustrating a portion of a conventional MRAM 200 that can include memory bitcells such as the MRAM bitcell 102 in FIG. 1. The MRAM 200 is divided into a data circuit 202, and reference circuits 204, 206. The data circuit 202 and the reference circuits 204, 206 include respective memory bitcells 208, 210, 212 that include respective data MTJs 214 and reference MTJs 216, 218 to provide a resistive memory element (only a single bitcell is illustrated to facilitate understanding). During read out of the memory bitcell 208 of the data circuit 202, the resistance of the data MTJ 214 is compared to the effective resistance of two reference MTJs 216, 218 connected in parallel, where one reference MTJ 216 is a reference parallel MTJ of the reference circuit 206 and the other reference MTJ 218 is the reference anti-parallel MTJ of the reference circuit 204. Resistance of the memory bitcells 208-212 is measured by applying a source voltage and determining an amount of current flowing through the memory bitcells 208-212. For example, in the memory bitcell 212 of the reference circuit 206 (e.g., parallel), a current source 220 is applied to the reference MTJ 218 by read select transistors 222, 224, and a word line select transistor 226. As shown using memory bitcell 212 as an example, the respective data and reference MTJs 214-218 of each of the memory bitcells 208-212 include a fixed or pinned layer 228, a tunneling layer 230, and a free layer 232. When the free layer 232 and the pinned layer 228 have magnetizations aligned substantially parallel, the resistance of the reference MTJ 218, and thus the memory bitcell 212, is lower. When the free layer 232 and the pinned layer 228 have magnetizations aligned substantially anti-parallel, the resistance of the reference MTJ 218, and thus the memory bitcell 212, is higher.

With reference to back to FIG. 1, the write current (I) required to be generated between the bit line (BL) and the source line (SL) of the MRAM bitcell 102 to change the magnetic orientation of the free layer 112 may be fifty (50) to three hundred (300) micro-Amps (μA) as an example. MRAM is an inherently scalable type of memory, because MTJ critical switching current (Ic) scales linearly with device area. As fabrication processes allow nodes to be further scaled down in size to reduce area for a given chip or package size, metal interconnection resistance increases due to the reduced cross-sectional area available for metal interconnects in the chip. Thus, for example, if a size of the MRAM bitcell 102 in FIG. 1 is maintained in a given chip or package as node size is scaled down, the amount of write current (I) generated across the MTJ 100 will drop due to the increased resistance in the bit line (BL) and the source line (SL) for a given supply voltage (Vs) (i.e., write current (I)=(Vsl−Vbl)/resistance). Thus, the write current (I) margin of the MTJ 100 is reduced, which can lead to reduced write performance of the MRAM bitcell 102 and yield loss.

To solve the issue of increased resistance in the MRAM bitcell 102 due to node size down scaling, the voltage (Vbl and Vsl) supplied by peripheral circuits can be increased to maintain the write current (I) to a required current level necessary to perform write operations in the MRAM bitcell 102. However, increasing the supply voltage (Vs) increases power consumption, which may be undesirable. This increased power consumption can be a limiting factor in an MRAM array size. But in many chip designs, it may not be possible to increase the supply voltage (Vs) because the supply voltage (Vs) is reduced in accordance with general semiconductor technology scaling, for example, to maintain gate dielectric integrity and to reduce overall power consumption in the chip value stored by the MTJ 100. Thus, as the critical switching current for writing to the MTJ 100 decreases, the sensing current used to measure the resistance of the MTJ 100 for reading its logical state (magnetization orientation) also decreases to prevent a read disturbance. For example, due to process variations, the sensing current used to measure the resistance of the MTJ 100 could exceed the critical switching current and change the logical state of the MTJ 100 being read.

Thus, increased scaling of MRAM leads to a reduced sensing margin. The reduction of sensing current may also cause reduced switching speed of the MTJ 100. Because the critical switching current of the MTJ 100 increases sharply when the pulse width of the switching current is decreased, one technique for preventing read disturbance in the MRAM bitcell 102 involves the application of a sensing current to the MTJ 100 with a shortened pulse width. For example, a sensing current having a pulse width of less than about ten (10) nanoseconds (ns) may be used for measuring the resistance of the MTJ 100. The sensing current pulse width may be reduced to a lower limit of about three (3) ns with reliable sensing. With technology scaling however, the switching current of the MTJ 100 will continue to decrease. Thus, as the sensing current pulse width approaches its lower limit with increased MTJ 100 scaling, sensing current should still be reduced to prevent read disturbances.

SUMMARY OF THE DISCLOSURE

Aspects of the present disclosure include metal-oxide semiconductor (MOS) transistor offset-cancelling (OC), zero-sensing (ZS) dead zone, current-latched sense amplifiers (SAs) (CLSAs) (OCZS-SAs) for sensing differential voltages. For example, an OCZS-SA may be part of memory read circuitry in a memory system for reading data from a memory array for a read operation. The OCZS-SA may be configured to receive differential data and reference input voltages from a sensing circuit in a resistive memory system indicative of the storage state of a memory bitcell(s). The OCZS-SA is configured to amplify the received differential data and reference input voltages with a smaller sense amplifier offset voltage to provide a larger sense margin between different storage states of the memory bitcell(s). In exemplary aspects disclosed herein, the OCZS-SA is configured to pre-charge gates of input and complement input transistors to their respective threshold voltages to cancel out offset voltages of the input and complement input transistors. Further, pre-charging the gates of the input and complement input transistors to the respective input and complement input transistor threshold voltages keeps the input and complement input transistors in their activated state during sensing phases so that sensing is not performed in their "dead zones" when their gate-to-source voltage (Vgs) is below their respective threshold voltages. The gates of the input and complement input transistors are further configured to receive the data and reference input voltages in voltage capture phases, after pre-charging the gates of the input and complement input transistors to the respective input and complement input transistor threshold voltages for amplifying the sensed differential voltage level between the data and reference input voltages.

In further exemplary aspects disclosed herein, to avoid the need to provide both sensing capacitor circuits to store the data and reference input voltages during an input phase, and then separate sense amplifier capacitors to store the data and reference input voltages at the gates of the input and complement input transistors during a voltage capture phase, an OCZS-SA is configured to pre-charge the gates of the input and complement input transistors to a supply node before the data and reference input voltages are received in voltage captures phases. Then, in a discharge phase before the voltage capture phases, the gates of the input and complement input transistors are discharged from the supply node to the threshold voltages of their respective input and complement input transistors to cancel their offset voltages while the data and reference input voltages are received and stored in sense amplifier capacitors coupled to the respective gates of the input and complement input transistors. In this manner, additional layout area that would otherwise be consumed with additional sensing capacitor circuits is avoided. Further, the sense amplifier capacitors in the OCZS-SA for storing the data and reference input voltages can be smaller, thus causing the OCZS-SA to consume even less layout area, because the OCZS-SA can still achieve the desired offset variation voltage.

In this regard, in one exemplary aspect, a sense amplifier is provided. The sense amplifier comprises a latch circuit. The latch circuit comprises an input node configured to receive a data input voltage. The latch circuit also comprises a complement input node configured to receive a reference input voltage. The latch circuit is configured to generate an amplified data output voltage on an output node and an amplified complement output voltage on a complement output node based on a differential voltage based on the data input voltage and the reference input voltage, in response to a sense amplifier phase signal. The sense amplifier comprises a data sense amplifier capacitor circuit configured to store the data input voltage from a sensing circuit. The sense amplifier also comprises a reference sense amplifier capacitor circuit configured to store the reference input voltage from the sensing circuit. The sense amplifier also comprises an input transistor comprising a gate coupled to the data sense amplifier capacitor circuit, the input transistor configured to couple the input node to a reference node based on the data input voltage stored in the data sense amplifier capacitor circuit, in response to the sense amplifier phase signal. The sense amplifier also comprises a complement input transistor comprising a gate coupled to the reference sense amplifier capacitor circuit, the complement input transistor configured to couple the complement input node to the reference node based on the reference input voltage stored in the reference sense amplifier capacitor circuit, in response to the sense amplifier phase signal. The sense amplifier also comprises a reference switch circuit coupled to the input transistor and the complement input transistor. The reference switch circuit is configured to adjust a voltage at the gate of the input transistor to an input threshold voltage of the input transistor, and a voltage at the gate of the complement input transistor to a complement input threshold voltage of the complement input transistor, to cancel offset voltages of the input transistor and the complement input transistor, in response to a discharge phase signal. The sense amplifier also comprises a data input circuit coupled to the data sense amplifier capacitor circuit. The data input circuit is configured to pass the data input voltage directly to the data sense amplifier capacitor circuit in response to a first voltage capture phase signal. The sense amplifier also comprises a reference input circuit coupled to the reference sense amplifier capacitor circuit. The reference input circuit is configured to pass the reference input voltage directly to the reference sense amplifier capacitor circuit in response to a second voltage capture phase signal.

In this regard, in one aspect, a sense amplifier is provided. The sense amplifier comprises a latching means. The latching means comprises a means for receiving a data input voltage. The latching means also comprises a means for receiving a reference input voltage. The latching means comprises a means for generating an amplified data output voltage on an output node and an amplified complement output voltage on a complement output node based on a differential voltage based on the data input voltage and the reference input voltage, in response to a sense amplifier phase signal. The sense amplifier also comprises a means for storing the data input voltage from a sensing circuit. The sense amplifier also comprises a means for storing the reference input voltage from the sensing circuit. The sense amplifier also comprises an input means coupled to the means for storing the data input voltage, the input means for coupling the means for receiving the data input voltage to a reference node based on the data input voltage stored in the means for storing the data input voltage. The sense amplifier also comprises a complement input means coupled to the means for storing the reference input voltage, the complement input means for comprising a gate coupled to the reference sense amplifier capacitor circuit, the complement input means for coupling the means for receiving the reference input voltage to the reference node based on the reference input voltage stored in the means for storing the reference input voltage. The sense amplifier also comprises a means for discharging coupled to the input means and the complement input means, for discharging the input means and discharging the complement input means to cancel offset voltages of the input means and the complement input means, in response to a discharge phase signal. The sense amplifier also comprises a data input means coupled to the means for storing the data input voltage, for passing the data input voltage directly to the means for storing the data input voltage in response to a voltage capture phase signal. The sense amplifier also comprises a reference input means coupled to the means for storing the reference input voltage, for passing the reference input voltage directly to the means for storing the reference input voltage in response to the voltage capture phase signal.

In another aspect, a method of sensing a differential voltage of a data input voltage and a reference input voltage is provided. The method comprises discharging a gate of an input transistor to an input threshold voltage of the input transistor and a gate of a complement input transistor to a complement input threshold voltage of the complement input transistor, to cancel offset voltages of the input transistor and the complement input transistor, in response to a discharge phase signal. The method also comprises storing a received data input voltage directly in a data sense amplifier capacitor coupled to the gate of the input transistor and in a reference sense amplifier capacitor coupled to the gate of the complement input transistor. The method also comprises adjusting both a voltage at the gate of the input transistor and the gate of the complement input transistor to the input threshold voltage plus the data input voltage, in response to a first voltage capture phase signal. The method also comprises pre-charging an output node and a complement output node of a latch circuit to a supply voltage at a supply node, in response to the first voltage capture phase signal. The method also comprises storing a received reference input voltage directly in the reference sense amplifier capacitor, in response to a second voltage capture phase signal. The method also comprises adjusting the voltage at the gate of the complement input transistor to the input threshold voltage plus the reference input voltage, in response to a second voltage capture phase signal. The method also comprises generating an amplified data output voltage on an output node and an amplified complement output voltage on a complement output node based on a differential voltage based on the data input voltage and the reference input voltage.

In another aspect, a resistive memory sensing system is provided. The resistive memory sensing system comprises a memory array comprising a plurality of resistive memory bitcells each comprising a data resistive memory element and a reference resistive memory element. A storage state of each of the plurality of resistive memory bitcells is based on a differential resistance between the data resistive memory element and the reference resistive memory element. The resistive memory sensing system also comprises a sensing circuit coupled to the memory array. The sensing circuit is configured to select a resistive memory bitcell among the plurality of resistive memory bitcells in response to a read operation. The sensing circuit is also configured to generate a data input voltage based on a resistance of the data resistive memory element of the selected resistive memory bitcell. The sensing circuit is also configured to generate a reference input voltage based on a resistance of the reference resistive memory element of the selected resistive memory bitcell. The resistive memory sensing system also comprises sense amplifier. The sense amplifier is configured to discharge a gate of an input transistor to an input threshold voltage of the input transistor and a gate of a complement input transistor to a complement input threshold voltage of the complement input transistor, to cancel offset voltages of the input transistor and the complement input transistor, in response to a discharge phase signal. The sense amplifier is also configured to store the data input voltage from the sensing circuit directly in a data sense amplifier capacitor coupled to the gate of the input transistor and in a reference sense amplifier capacitor coupled to the gate of the complement input transistor. The sense amplifier is also configured to adjust both a voltage at the gate of the input transistor and the gate of the complement input transistor to the input threshold voltage plus the data input voltage, in response to a voltage capture phase signal. The sense amplifier is also configured to pre-charge an output node and a complement output node of a latch circuit to a supply voltage at a supply node, in response to a first voltage capture phase signal. The sense amplifier is also configured to store the reference input voltage received from the sensing circuit directly in the reference sense amplifier capacitor, in response to a second voltage capture phase signal. The sense amplifier is also configured to adjust the voltage at the gate of the complement input transistor to the input threshold voltage plus the reference input voltage, in response to the second voltage capture phase signal. The sense amplifier is also configured to generate an amplified data output voltage on the output node and an amplified complement output voltage on the complement output node based on a differential voltage based on the data input voltage and the reference input voltage.

BRIEF DESCRIPTION OF THE FIGURES

FIGS. 11A-11D illustrate different operational phases of the OCZS-SA in FIG. 9 for sensing between data and reference input voltages as an indication of a storage state of a resistive memory bitcell from directly stored data and reference input voltages from a sensing circuit into sense amplifier capacitors without the need for providing separate sense amplifier capacitors;

FIGS. 13A and 13B are respective diagrams illustrating exemplary layouts of the components of the sensing systems in FIG. 6 and FIG. 9 to illustrate exemplary layout differences between the NOC-CLSA and OCZS-SA provided therein;

DETAILED DESCRIPTION

Figure 1:
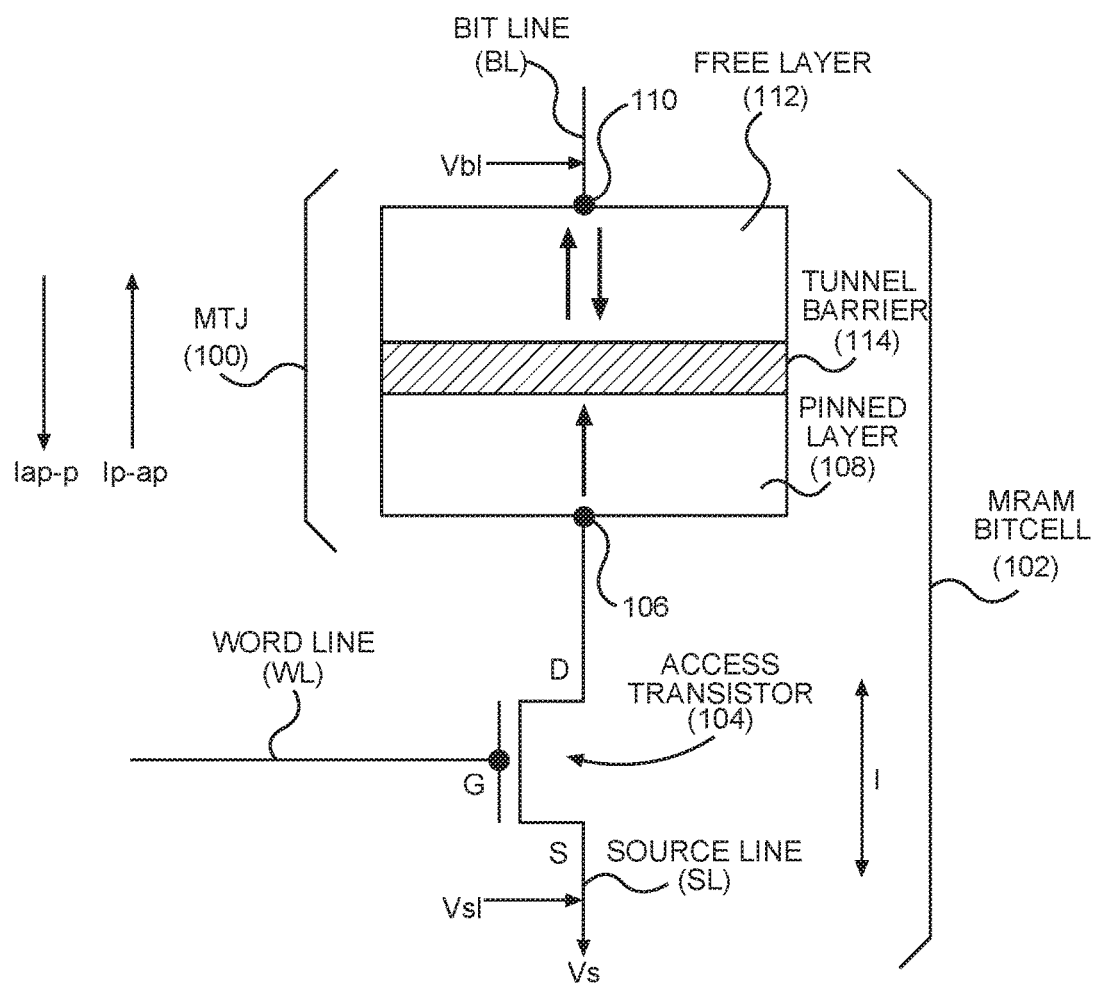
FIG. 1 is a schematic diagram of an exemplary magnetic random access memory (MRAM) bitcell employing a magnetic tunnel junction (MTJ) element, wherein the MRAM bitcell can be provided in an MRAM array in an integrated circuit (IC)
Figure 2:
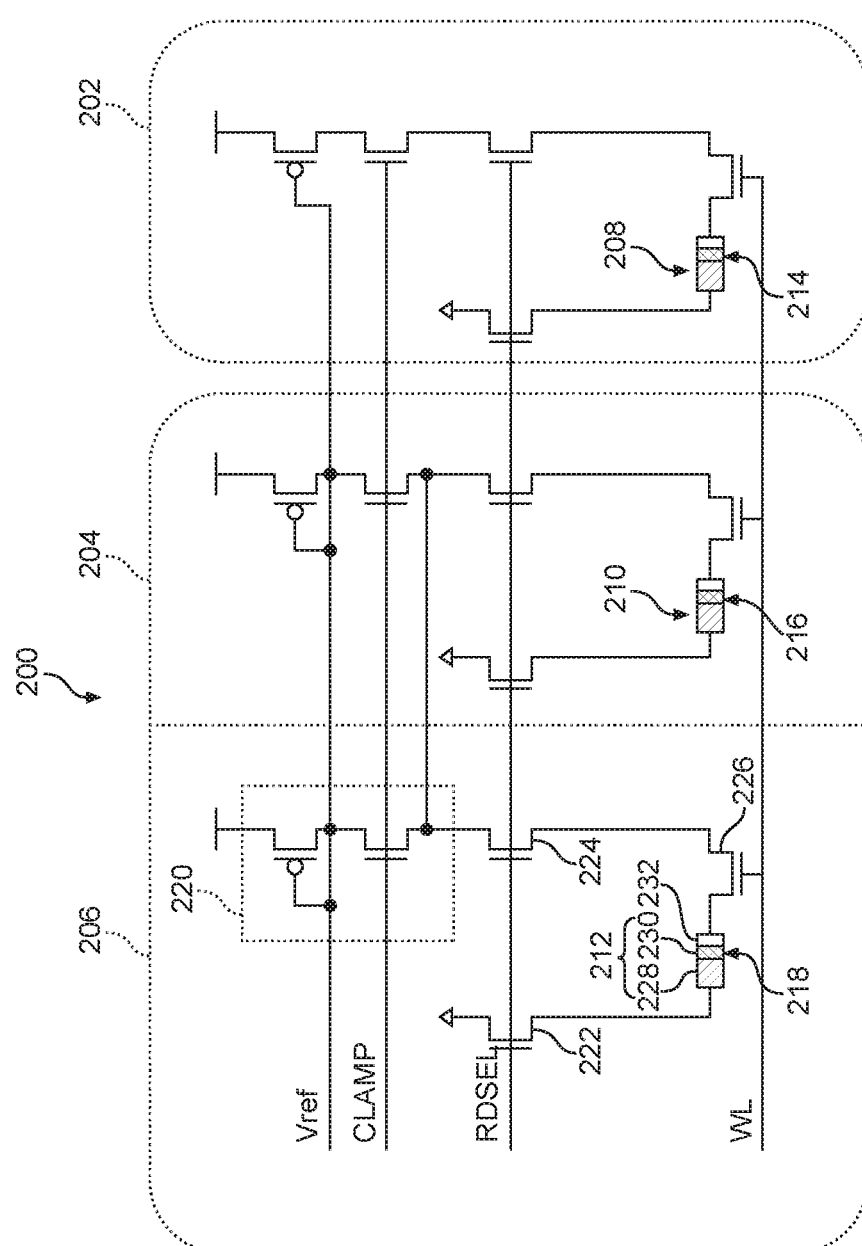
FIG. 2 is a schematic diagram of a resistive memory circuit for writing and reading a resistive memory bitcell.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure include metal-oxide semiconductor (MOS) transistor offset-cancelling (OC), zero-sensing (ZS) dead zone, current-latched sense amplifiers (SAs) (CLSAs) (OCZS-SAs) for sensing differential voltages. For example, an OCZS-SA may be part of memory read circuitry in a memory system for reading data from a memory array for a read operation. The OCZS-SA may be configured to receive differential data and reference input voltages from a sensing circuit in a resistive memory system indicative of the storage state of a memory bitcell(s). The OCZS-SA is configured to amplify the received differential data and reference input voltages with a smaller sense amplifier offset voltage to provide a larger sense margin between different storage states of the memory bitcell(s). In exemplary aspects disclosed herein, the OCZS-SA is configured to pre-charge gates of input and complement input transistors to their respective threshold voltages to cancel out offset voltages of the input and complement input transistors. Further, pre-charging the gates of the input and complement input transistors to the respective input and complement input transistor threshold voltages keeps the input and complement input transistors in their activated state during sensing phases so that sensing is not performed in their "dead zones" when their gate-to-source voltage (Vgs) is below their respective threshold voltages. The gates of the input and complement input transistors are further configured to receive the data and reference input voltages in voltage capture phases, after pre-charging the gates of the input and complement input transistors to the respective input and complement input transistor threshold voltages for amplifying the sensed differential voltage level between the data and reference input voltages.

In further exemplary aspects disclosed herein, to avoid the need to provide both sensing capacitor circuits to store the data and reference input voltages during an input phase, and then separate sense amplifier capacitors to store the data and reference input voltages at the gates of the input and complement input transistors during a voltage capture phase, an OCZS-SA is configured to pre-charge the gates of the input and complement input transistors to a supply node before the data and reference input voltages are received in voltage captures phases. Then, in a discharge phase before the voltage capture phases, the gates of the input and complement input transistors are discharged from the supply node to the threshold voltages of their respective input and complement input transistors to cancel their offset voltages while the data and reference input voltages are received and stored in sense amplifier capacitors coupled to the respective gates of the input and complement input transistors. In this manner, additional layout area that would otherwise be consumed with additional sensing capacitor circuits is avoided. Further, the sense amplifier capacitors in the OCZS-SA for storing the data and reference input voltages can be smaller, thus causing the OCZS-SA to consume even less layout area, because the OCZS-SA can still achieve the desired offset variation voltage.

Before discussing examples of OCZS-SAs configured to directly store data input voltages and reference input voltages from a sensing circuit into sense amplifier capacitors without the need for providing separate sense amplifier capacitors starting at FIG. 9, FIGS. 3-8 are first discussed below.

Figure 3:
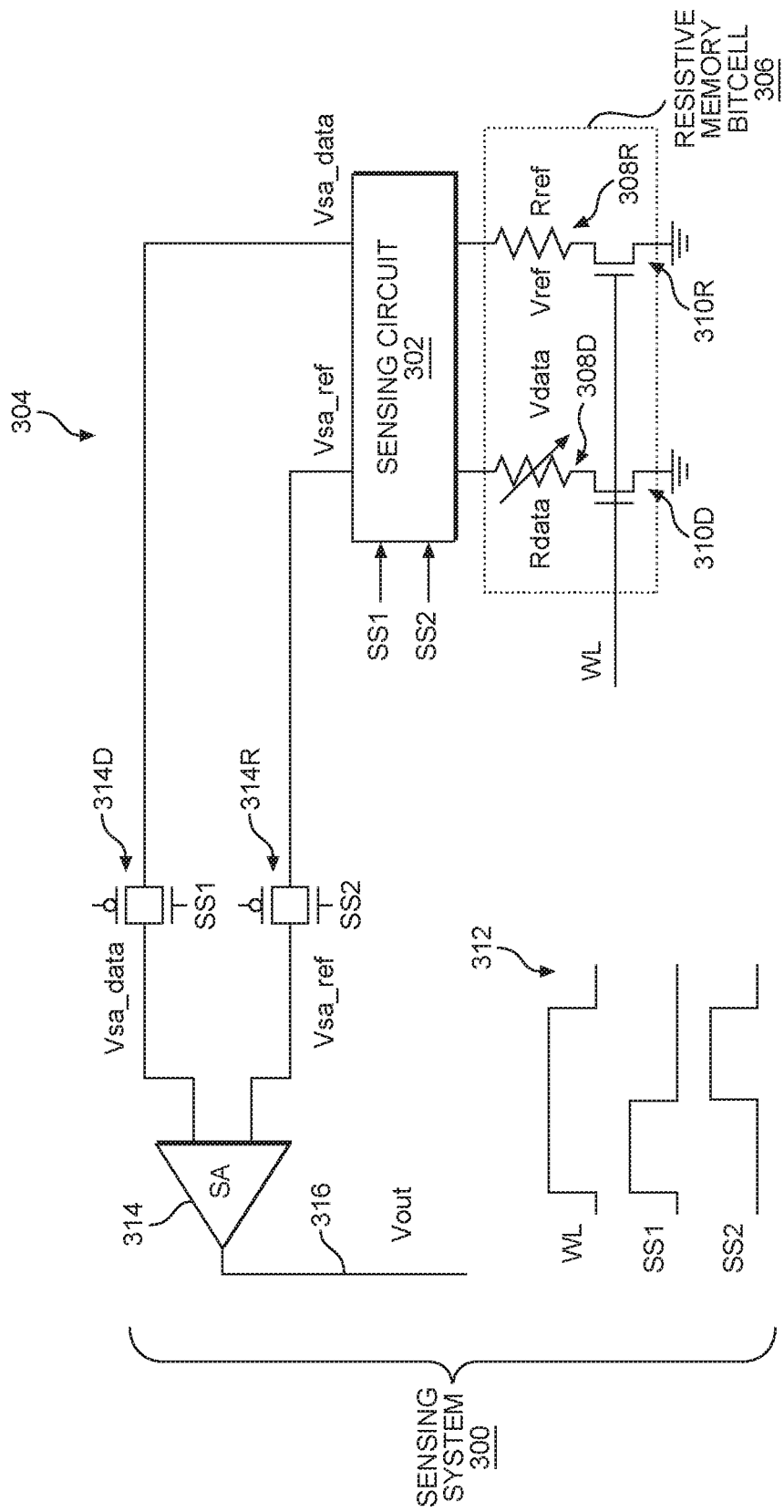
FIG. 3 is a sensing system including a sensing circuit configured to provide differential data and reference input voltages representing a sensed state of a resistive memory bitcell, as input data and reference input voltages to a sense amplifier, wherein the sense amplifier is configured to generate an amplified output voltage signal indicative of an amplified difference between data and reference input voltages as an indication of a storage state of the resistive memory bitcell.

FIG. 3 is a sensing system 300 including a sensing circuit 302 that can be provided in a conventional magnetic random access memory (MRAM) 304 for sensing (i.e., reading) a storage state of resistive memory bitcells 306 in response to a read operation. FIG. 3 includes one resistive memory bitcell 306 for illustrative purposes, but note that the MRAM 304 could include an array of resistive memory bitcells 306. The sensing circuit 302 is configured to provide differential voltages in the form of a voltage data Vsa_data and a reference input voltage Vsa_ref representing a sensed storage state of the resistive memory bitcell 306. For example, the resistive memory bitcell 306 includes a data resistive memory element 308D (Rdata) and a reference resistive memory element 308R (Rref) whose resistances change as a function of a magnetization state. For example, the data resistive memory element 308D (Rdata) could be magnetic tunnel junction (MTJ) device and the reference resistive memory element 308R (Rref) a fixed resistance. When the resistive memory bitcell 306 is to be accessed, a word line (WL) is activated to activate access transistors 310D, 310R. A current is directed through the data resistive memory element 308D (Rdata) and the reference resistive memory element 308R (Rref) to generate data and reference input voltages Vdata, Vref. The data voltage Vdata is a function of the storage state of the data resistive memory element 308D (Rdata). For example, the data resistive memory element 308D (Rdata) may be an MTJ whose resistance is a function of the magnetization state. The reference input voltage Vref is a function of the resistance of the reference resistive memory element 308R (Rref). Thus, the data and reference input voltages Vdata, Vref represent a differential voltage that is indicative of the storage state of the resistive memory bitcell 306. The sensing circuit 302 is configured to sense these data and reference input voltages Vdata, Vref. For example, the sensing circuit 302 may be configured to sense the data voltage Vdata during a first sensing phase (SS1) and sense the reference input voltage Vref during a second sensing phase (SS2) as shown in a timing diagram 312 in FIG. 3. The sensing circuit 302 generates an data input voltage Vsa_data and a reference input voltage Vsa_ref as a function of the sensed data and reference input voltages Vdata, Vref from the resistive memory bitcell 306. As an example, the sensing circuit 302 may be the N-type (N) MOS offset-cancelling (OC) current-latched (CL) sense amplifier (SA) (NOC-CLSA) in U.S. Pat. No. 9,165,630, incorporated by reference herein in its entirety.

With continuing reference to FIG. 3, a sense amplifier (SA) 314 is also provided in the sensing system 300. The sense amplifier 314 is configured to receive input voltage Vsa_data and a reference input voltage Vsa_ref from the sensing circuit 302. For example, a data input circuit 314D and a reference input circuit 314R in the form of pass gates for example, are provided to control the timing of the sense amplifier 314 receiving the data input voltage Vsa_data and the reference input voltage Vsa_ref from the sensing circuit 302. As shown in FIG. 3, the data input circuit 314D is configured to pass the data input voltage Vsa_data during the first sensing phase (SS1). The reference input circuit 314R is configured to pass the reference input voltage Vsa_ref during the second sensing phase (SS2). The sense amplifier 314 is configured to sense the data input voltage Vsa_data and the reference input voltage Vsa_ref based on the differential voltage therebetween to generate an amplified data output voltage Vout on an output node 316 indicative of the storage state of the resistive memory bitcell 306. For example, it may be desired to provide for the sense amplifier 314 to generate an amplified data output voltage Vout that has a large voltage differential between a '0' storage state and a '1' storage state to provide a larger sensing margin to avoid or mitigate read disturbance errors during a read operation.

Figure 4:
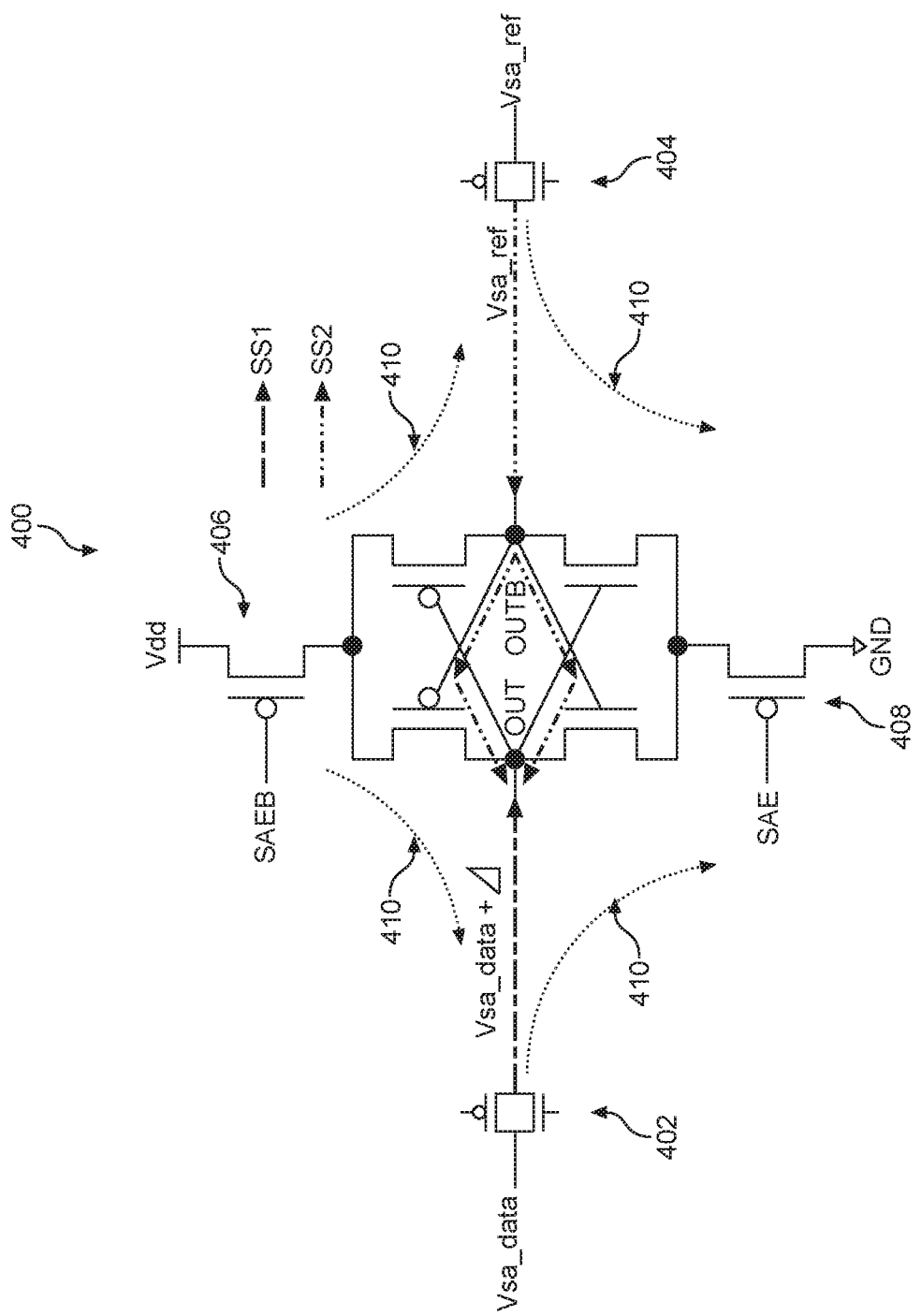
FIG. 4 is a schematic diagram of a conventional voltage latch sense amplifier (VLSA) for sensing between data and reference input voltages as an indication of a storage state of a resistive memory bitcell, and illustrating capacitive coupling between data and reference input voltages.

FIG. 4 is a schematic diagram illustrating a conventional voltage level sense amplifier (VLSA) 400 that may be employed as the sensing circuit 302 in FIG. 3. The conventional VLSA 400 includes transmission gate access transistors 402, 404 configured to transfer a voltage level of the data input voltage Vsa_data and the reference input voltage Vsa_ref to output nodes OUT and OUTB, respectively, without threshold voltage Vth loss. For NMOS access transistors, threshold voltage Vth loss occurs when the input voltage is higher than supply voltage Vdd−Vthn. Similarly, for PMOS access transistors, threshold voltage Vth loss occurs when the input voltage is lower than Vthn. Thus, the transmission gate access transistors 402, 404 are used to avoid threshold losses for a voltage range from GND to Vdd. A head switch PMOS transistor 406 and a foot switch NMOS transistor 408 are used in the conventional VLSA 400 to prevent the occurrence of invalid current paths 410 that would affect values of the data input voltage Vsa_data and the reference input voltage Vsa_ref before a sense amplifier phase signal (SAE, SAEB) is activated. However, the conventional VLSA circuit 400 cannot be effectively coupled to the sensing circuit 302 that is an NOC-CLSA shown in FIG. 3, because capacitive coupling may occur in the first and second sensing phases (SS1, SS2) between the reference input voltage Vsa_ref and the data input voltage Vsa_data, as shown in FIG. 4.

Figure 5B:
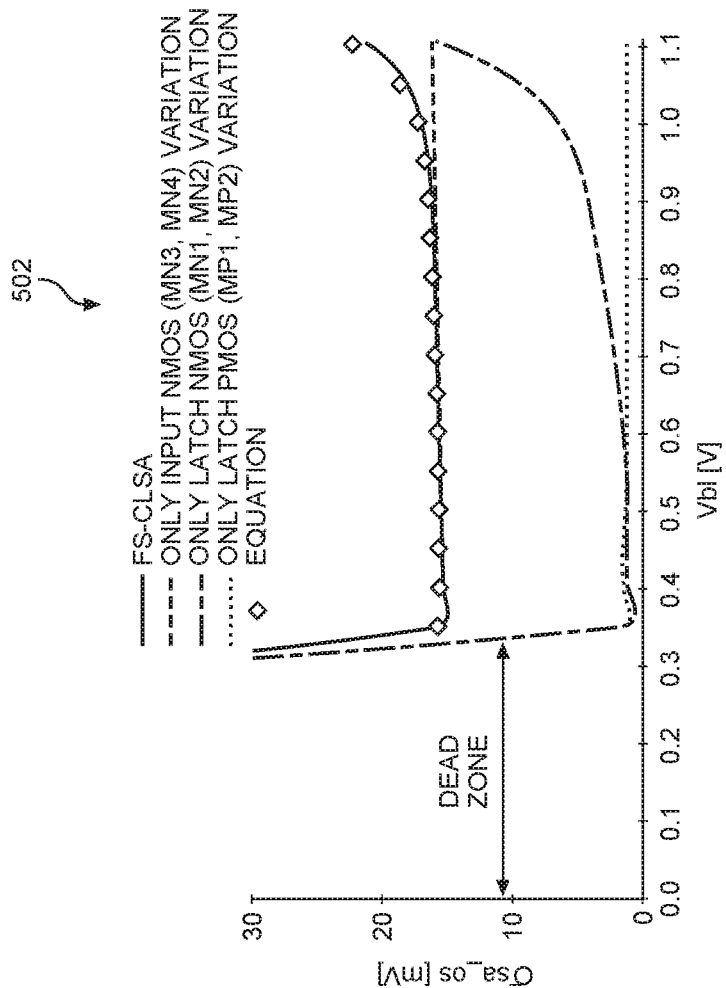
FIG. 5B is a graph of a standard deviation of an offset variation voltage of the CLSA in FIG. 5A as a function of an input voltage to input transistors in the CLSA to illustrate a sensing dead-zone in the CLSA when the input voltage is below threshold voltages of input transistors.
Figure 5A:
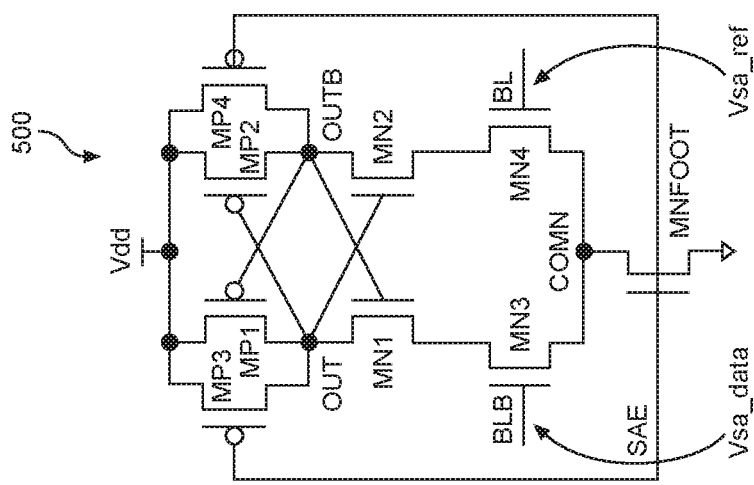
FIG. 5A is a schematic diagram of a conventional current-latched sense amplifier (CLSA) for sensing between data and reference input voltages as an indication of a storage state of the resistive memory bitcell.

FIG. 5A is an example of a conventional current-latched sense amplifier (CLSA) 500 that may be employed as the sensing circuit 302 in FIG. 3 to avoid the capacitive coupling issue with VLSAs. But, as shown in FIG. 5A, the CLSA 500 is a dead sensing zone, because of input and complement input transistors MN4, MN3. The sensing dead zone of the CLSA 500 occurs when the data input voltage Vsa_data or the reference input voltage Vsa_ref is lower than the threshold voltage Vthn of the input and complement input transistors MN4, MN3, respectively, because input and complement input transistors MN4, MN3 are not turned on when the data input voltage Vsa_data or the reference input voltage Vsa_ref is lower than then threshold voltage Vth. This dead zone is shown in FIG. 5B, which is a graph 502 of a standard deviation of an offset variation voltage (σsa_os) in milliVolts (mV) of the CLSA 500 in FIG. 5A as a function of the input voltage in Volts (V) provided to the input and complement input transistors MN4, MN3 as the reference input voltage Vsa_ref and the data input voltage Vsa_data.

Figure 6:
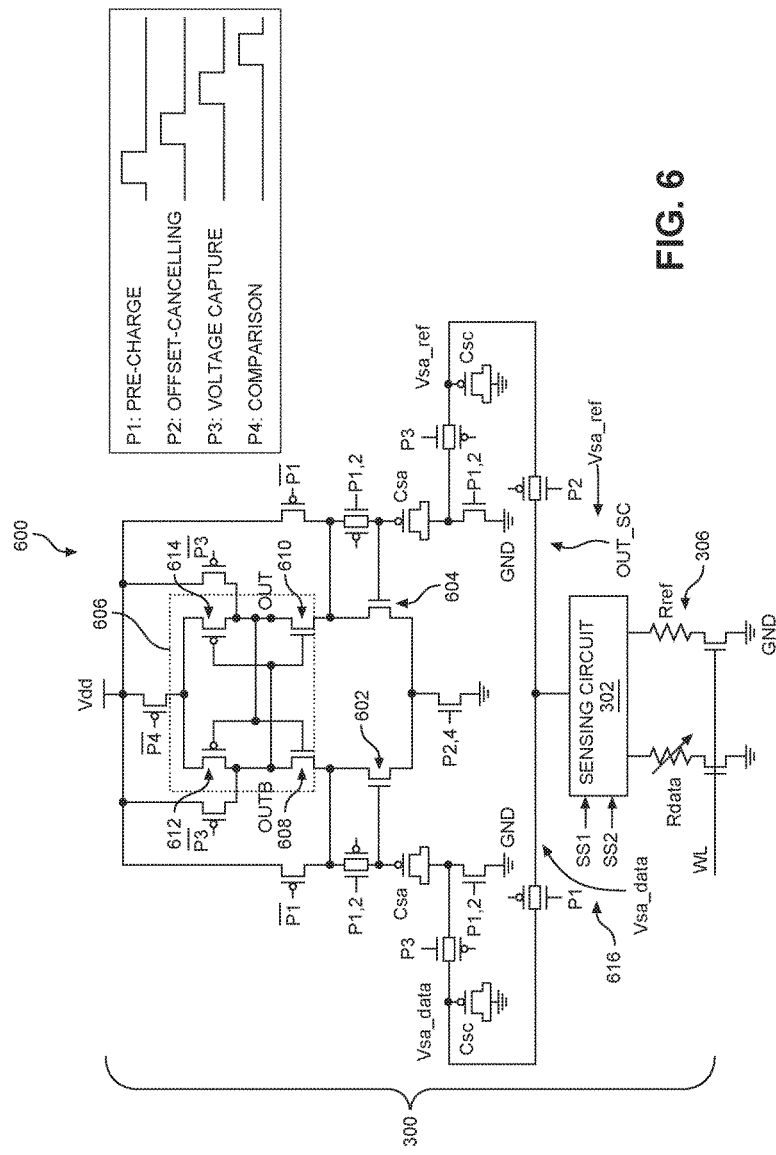
FIG. 6 is a schematic diagram of an exemplary sensing system for sensing a storage state of a resistive memory bitcell, wherein the sensing system includes the sensing circuit in FIG. 3 and an N-type (N) metal-oxide semiconductor (MOS) transistor offset-cancelling (OC), current-latched (CL) sense amplifier (SA) (CLSA) (NOC-CLSA) configured to cancel offset voltages of input transistors that receive input data and reference input voltages from the sensing circuit while providing a zero-sensing dead zone of the NOC-CLSA.

To avoid the issues with capacitive coupling in a VLSA used as a sense amplifier as shown for example in FIG. 4, and the sensing dead zone in a CLSA used as a sense amplifier as shown for example in FIG. 5A, an NMOS offset-cancelling current-latched sense amplifier (NOC-CLSA) 600 in FIG. 6 can be employed in the sensing system 300 in FIG. 3. The sensing circuit 302 and resistive memory bitcell 306 from FIG. 3 are also shown in FIG. 6, and thus will not be re-described. The NOC-CLSA 600 overcomes the capacitive coupling drawbacks of the VLSA 400 in FIG. 4 and sensitivity to input transistor offset. Thus, the NOC-CLSA 600 may be employed as the sense amplifier 314 in the sensing system 300 in FIG. 3.

Referring to FIG. 6, the NOC-CLSA 600 is responsive to a sequence of four phase signals P1, P2, P3, P4 during a corresponding four (4) phases of operation. In a first phase of operation P1, which is a pre-charge phase, nodes of the NOC-CLSA 600 that are labeled P1 are energized. In a second phase of operation P2, which is an offset-cancelling phase, nodes of the NOC-CLSA 600 that are labeled P2 are energized. In a third phase of operation P3, which is a voltage capture phase, nodes of the NOC-CLSA 600 that are labeled P3 are energized. In a fourth phase of operation P4, which is a comparison phase, nodes of the NOC-CLSA 600 that are labeled P4 are energized. Nodes of the NOC-CLSA 600 that are labeled $\overline{P1}$ are energized when nodes labeled P1 are not energized, nodes of the NOC-CLSA 600 that are labeled $\overline{P2}$, are energized when nodes labeled P2 are not energized, nodes of the NOC-CLSA 600 that are labeled $\overline{P3}$ are energized when nodes labeled P3 are not energized, and nodes of the NOC-CLSA 600 that are labeled $\overline{P4}$ are energized when nodes labeled P4 are not energized.

With continuing reference to FIG. 6, offset voltage is predominantly determined by input NMOS transistors 602, 604. The input NMOS transistors 602, 604 are coupled to a latch circuit 606, which includes latch NMOS transistors 608, 610 and latch PMOS transistors 612, 614. According to this example, the input NMOS transistors 602, 604 are not part of the latch circuit 606, but are selectively coupled between the latch circuit 606 and a first fixed voltage. By providing an input path that avoids the latch circuit 606, the NOC-CLSA 600 significantly reduces input capacitance, compared to the VLSA 400 in FIG. 4, for example. The first fixed voltage is described herein as a ground node (GND); however, aspects of the present disclosure can include configurations in which the first fixed voltage is not necessarily a ground node (GND). As discussed in more detail below, the NOC-CLSA 600 cancels the threshold voltage Vth mismatch of the input NMOS transistors 602, 604 during the pre-charge phase P1 and the offset-cancelling phase P2 of operation.

Figure 7A:
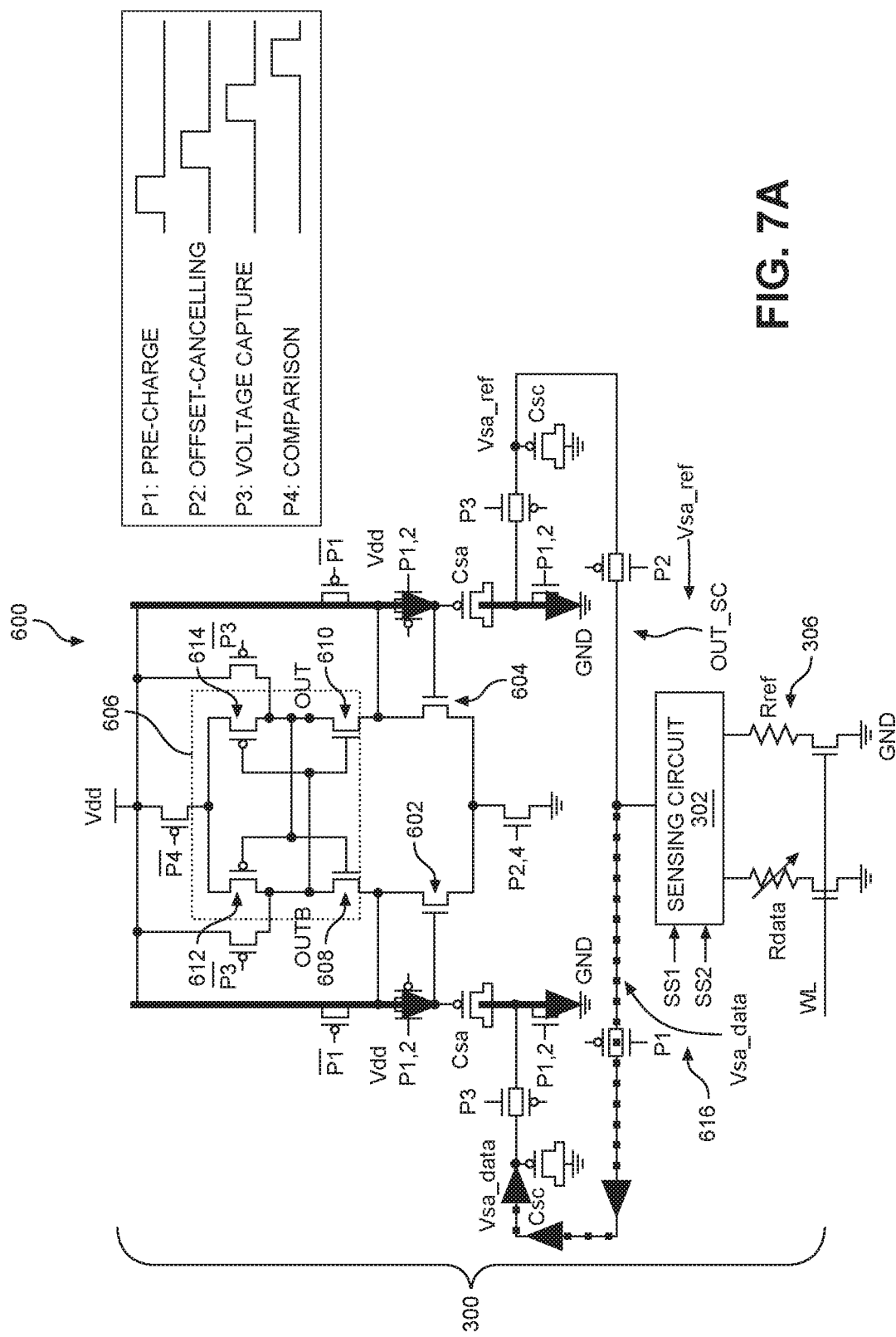
FIGS. 7A-7D illustrate different operational phases of the NOC-CLSA in FIG. 6 for sensing between data and reference input voltages as an indication of a storage state of a resistive memory bitcell.

The pre-charge phase of operation P1 for a NOC-CLSA 600 is described with reference to FIG. 7A. During the pre-charge phase P1, the respective gates of the input NMOS transistors 602, 604 are pre-charged to a second fixed voltage. The second fixed voltage is described as a supply voltage Vdd. An output 616 from the NOC-CLSA 600 provides a data input voltage Vsa_data that is stored in a first isolated sensing capacitor circuit (Csc) 618.

Figure 7B:
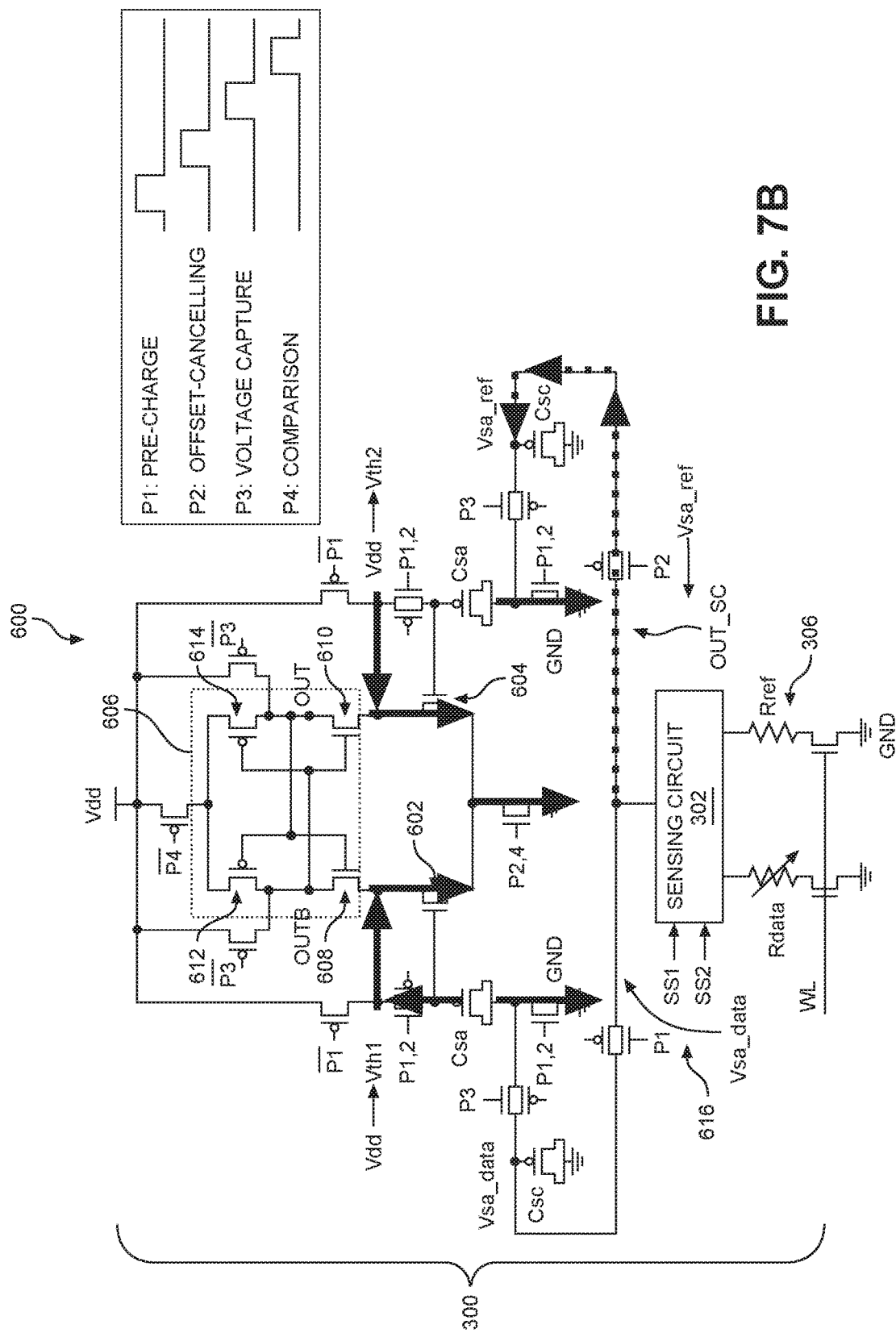

The offset-cancelling phase of operation P2 for the NOC-CLSA 600 is described with reference to FIG. 7B. During the offset-cancelling phase P2, the respective gates of the input NMOS transistors 602, 604 are de-coupled from the supply voltage Vdd and discharged to their respective threshold voltages Vth. Thus, the offsets of the input NMOS transistors 602, 604 are cancelled out. During the offset-cancelling phase P2, the output 616 from the NOC-CLSA 600 provides a reference input voltage Vsa_ref, which is stored in a second isolated sensing capacitor circuit Csc 620.

Figure 7C:
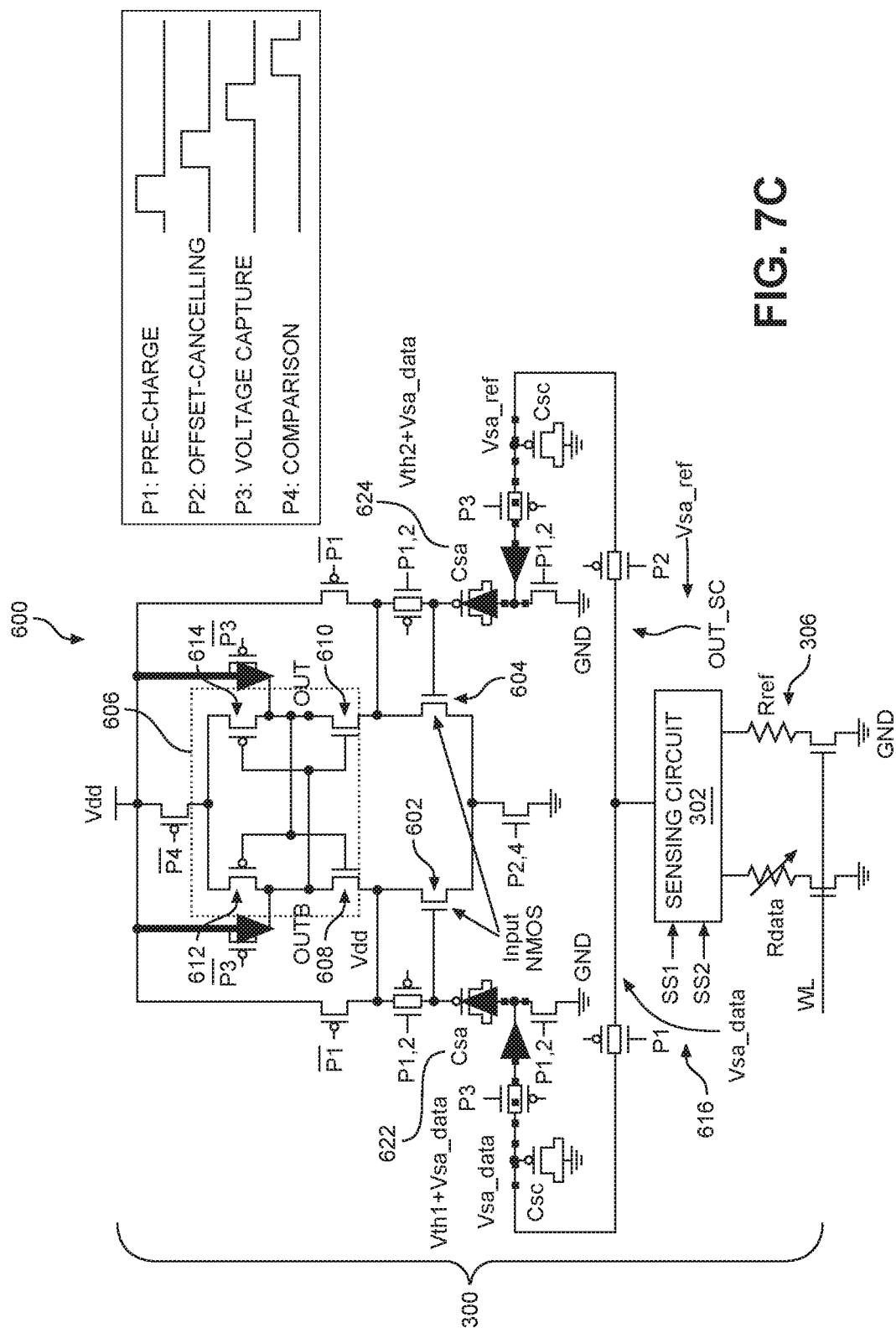

The voltage capture phase of operation P3 for the NOC-CLSA 600 is described with reference to FIG. 7C. In the voltage capture phase P3, the data input voltage Vsa_data is provided from the first isolated sensing capacitor circuit (Csc) 618 to a first sense amplifier capacitor circuit (Csa) 622 to be stored. The data input voltage Vsa_data is captured at the gate of the first one of the input NMOS transistors 602. Similarly, the reference input voltage Vsa_ref is provided from the second isolated sensing capacitor circuit (Csc) 620 to a second sense amplifier capacitor circuit (Csa) 624 to be stored. The reference input voltage Vsa_ref is captured at the gate of the second one of the input NMOS transistors 604. Because the overdrive voltage (Vgs-Vth), which determines driving current of the input NMOS transistors 602, 604, does not depend on the threshold voltage Vth variation, offset cancellation of the input NMOS transistors 602, 604 is achieved while avoiding a sensing dead zone.

Figure 7D:
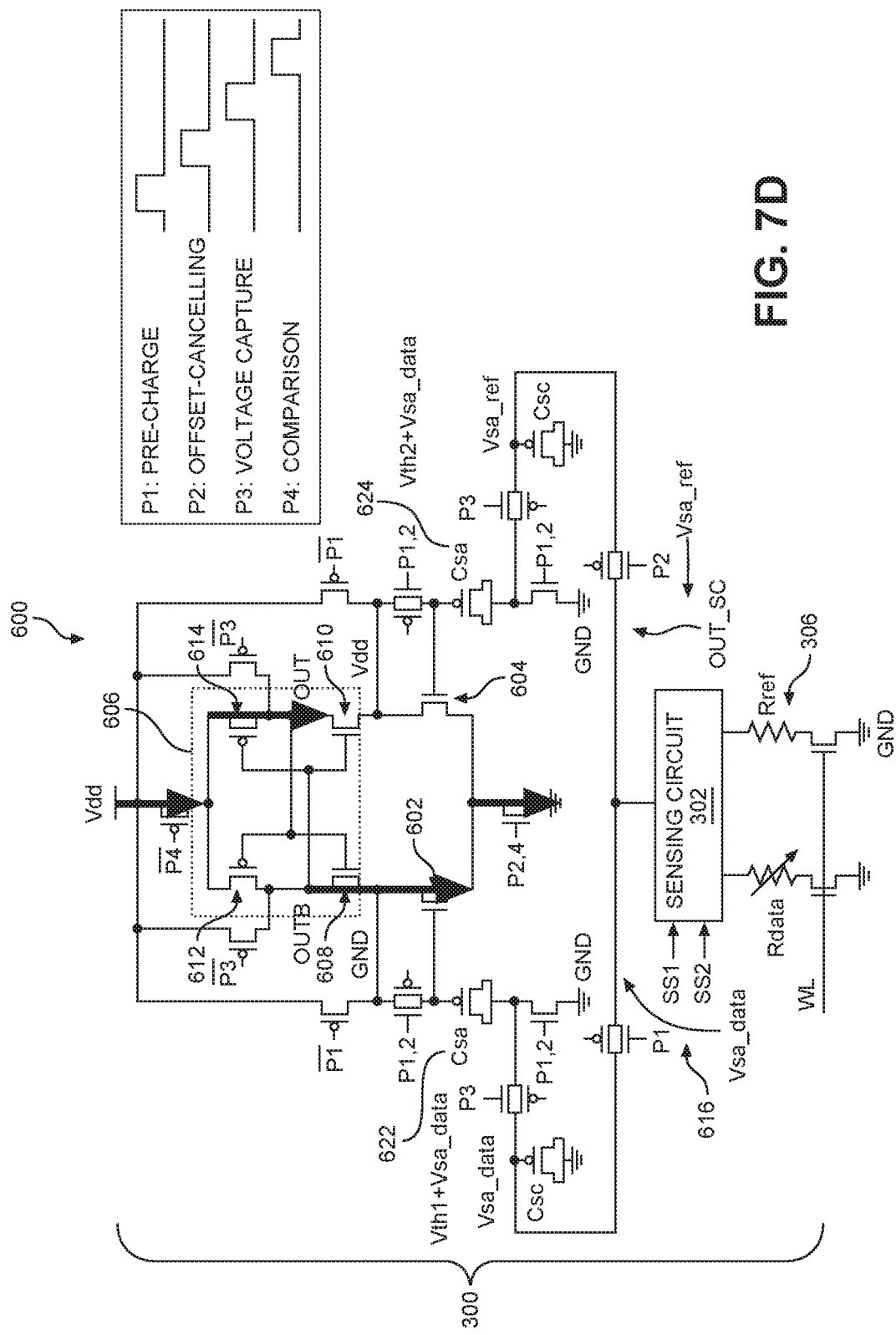

The comparison phase of operation P4 for the NOC-CLSA 600 is described with reference to FIG. 7D. When the data input voltage Vsa_data is greater than the reference input voltage Vsa_ref in the comparison phase (P4), a first output node (OUT) 626 of the latch circuit 606 is coupled to the supply voltage Vdd, and a second output node (OUTB) 628 is coupled to a ground node (GND) to provide an amplified data output voltage representing a first storage state of the resistive memory bitcell 306. When the reference input voltage Vsa_ref is higher than the data input voltage Vsa_data in the comparison phase (P4), the first output node (OUT) 626 is coupled to the ground node (GND), and the second output node (OUTB) 628 is coupled to the supply voltage Vdd to provide an amplified reference output voltage representing a second storage state of the resistive memory bitcell 306, opposite of the first storage state.

Figure 8:
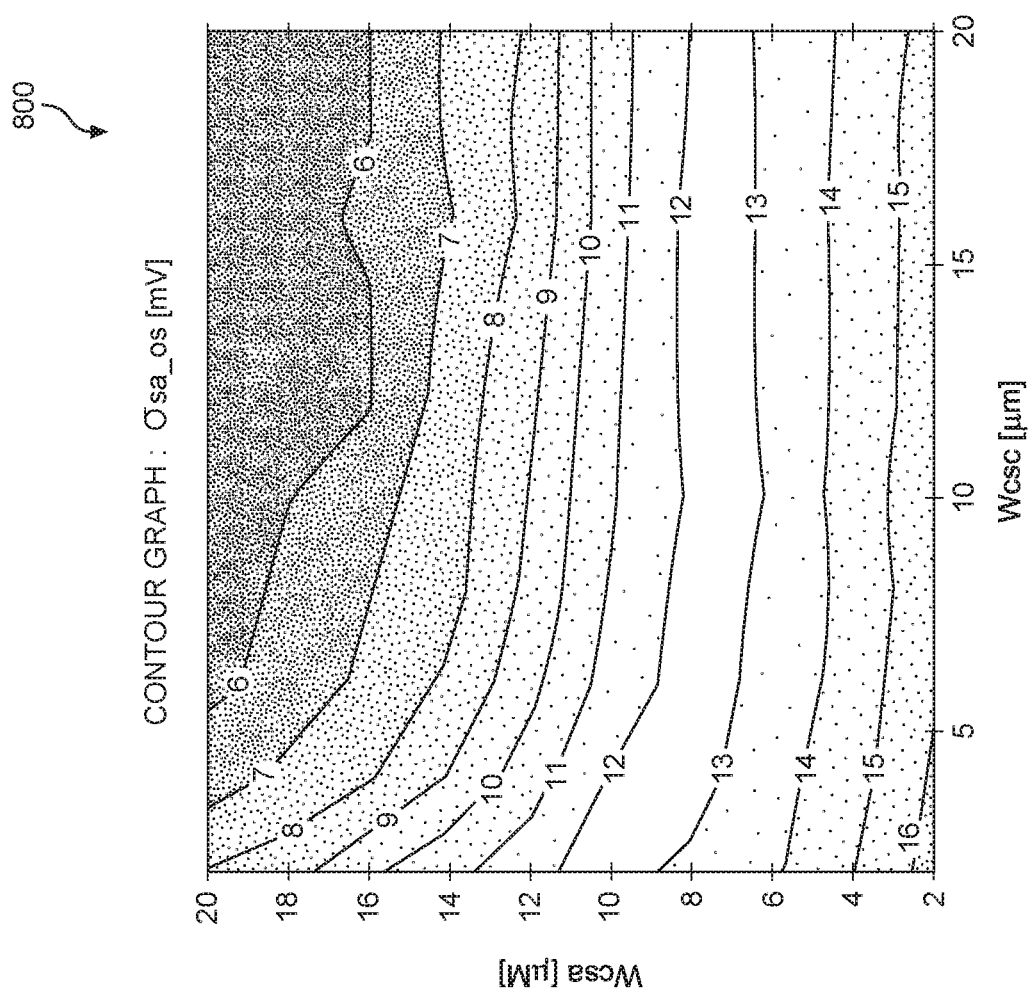
FIG. 8 is a graph illustrating a width of sense amplifier capacitors in the NOC-CLSA in FIG. 6 as a function of a width of sensing capacitor circuits in the NOC-CLSA.

FIG. 8 is a graph 800 illustrating a width of sense amplifier capacitor circuits (Csa) 622, 624 in the NOC-CLSA 600 in FIG. 6 as a function of the width of the sensing capacitor circuits (Csc) 618, 620. As shown therein, the sizes for the sensing capacitor circuits (Csc) 618, 620 and the sense amplifier capacitor circuits (Csa) 622, 624 are quite large (e.g., $W_{CSA}$=20 µm/$L_{CSA}$=0.2 µm, $W_{CSC}$=10 µm/$L_{CSC}$=0.2 µm) to achieve an offset variation voltage (σsa_os) of 6-7 mV. This is because the data input voltage Vsa_data and the reference input voltage Vsa_ref are transferred to the gate of the input NMOS transistors 602, 604 by using charge sharing between the sensing capacitor circuits (Csc) 618, 620 and the sense amplifier capacitor circuits (Csa) 622, 624. Thus, because the four (4) large capacitors are required (i.e., two (2) sensing capacitor circuits (Csc) 618, 620, and two (2) sense amplifier capacitor circuits (Csa) 622, 624), this causes significant layout area overhead for providing the NOC-CLSA 600 in FIG. 6 in a memory system, such as the MRAM 304 in FIG. 3.

Figure 9:
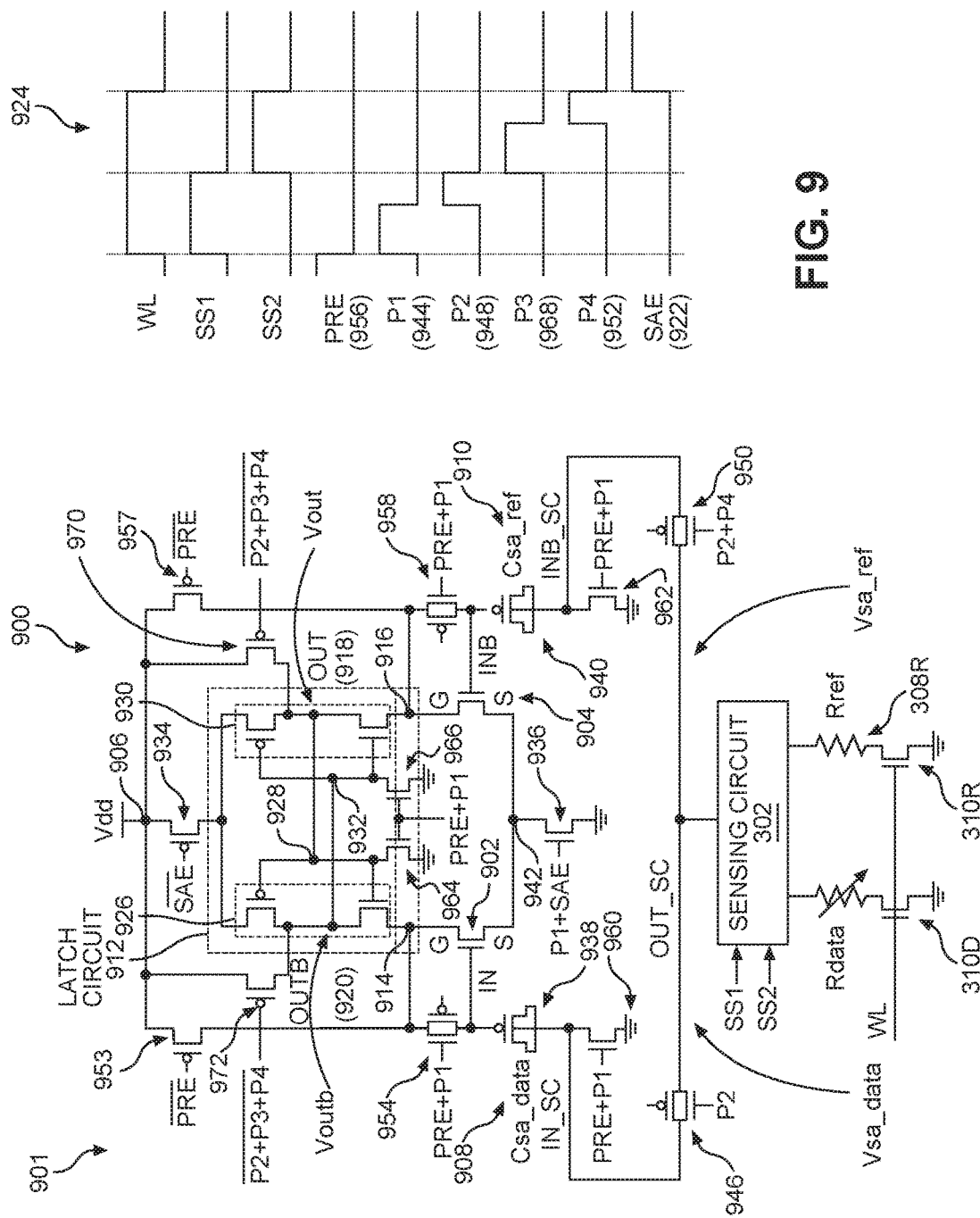
FIG. 9 is a diagram of another exemplary sensing system that includes a sensing circuit configured to provide input data and reference input voltages representing a storage state of a resistive memory bitcell to an offset-cancelling, zero-sensing dead zone, current-latched CLSA (OCZS-SA) configured to cancel offset voltages of input transistors that receive input data and reference input voltages from the sensing circuit while providing a zero-sensing dead zone of the OCZS-SA, wherein the OCZS-SA is also configured to directly store the data input voltage and reference input voltage from the sensing circuit into sense amplifier capacitors without the need for providing separate sense amplifier capacitors.

In this regard, to avoid the need for additional capacitor circuits such as the two (2) sensing capacitor circuits (Csc) 618, 620 in an OCZS-SA, an alternative OCZS-SA 900 is provided in FIG. 9. The OCZS-SA 900 can be provided in an integrated circuit (IC) 901 as an example, which may also include a memory system. As will be described in more detail below, the OCZS-SA 900 is configured to pre-charge the gates (G) of input and complement input transistors 902, 904 to a supply voltage Vdd on a supply node 906 before a data input voltage Vsa_data and a reference input voltage Vsa_ref are received in voltage captures phases. The input and complement input transistors 902, 904 may be NMOS transistors as an example, as shown. Then, in a discharge phase before the voltage capture phases, the gates (G) of the input and complement input transistors 902, 904 are discharged from the supply node 906 to the threshold voltages Vth of their respective input and complement input transistors 902, 904 to cancel their offset voltages while the data input voltage Vsa_data and the reference input voltage Vsa_ref are received and stored in sense amplifier capacitors (Csa) 908, 910 coupled to the respective gates (G) of the input and complement input transistors 902, 904. In this manner, additional layout area that would otherwise be consumed with additional sensing capacitor circuits is avoided. Further, the sense amplifier capacitors (Csa) 908, 910 in the OCZS-SA 900 for storing the data input voltage Vsa_data and the reference input voltage Vsa_ref, respectively, can be smaller, thus causing the OCZS-SA 900 to consume even less layout area, because the OCZS-SA 900 can still achieve the desired offset variation voltage. Before the phase operation of the OCZS-SA 900 is described starting at FIG. 10, the components and elements of the OCZS-SA 900 are first described with regard to FIG. 9.

In this regard, the OCZS-SA 900 includes a latch circuit 912. The latch circuit 912 includes an input node 914 configured to receive the data input voltage Vsa_data during a sensing phase. The latch circuit 912 also includes a complement input node 916 configured to receive the reference input voltage Vsa_ref during a sensing phase. The latch circuit 912 is configured to generate an amplified data output voltage Vout on an output node (OUT) 918 and an amplified complement output voltage Voutb on a complement output node (OUTB) 920 on a differential voltage based on the data input voltage Vsa_data and the reference input voltage Vsa_ref, in response to a sense amplifier phase signal (SAE) 922, as also shown in a timing diagram 924 in FIG. 9. In this example, the latch circuit 912 includes a first inverter 926 that includes a first inverter input node 928, which is the complement output node (OUTB) 920. The first inverter 926 is configured to invert a signal on the first inverter input node 928 to the complement output node (OUTB) 920. The latch circuit 912 also includes a second inverter 930 that includes a second inverter input node 932 and an output node, which is the output node (OUT) 918. The complement output node (OUTB) 920 is coupled to the second inverter input node 932, and the output node (OUT) 918 is coupled to the first inverter input node 928 such that the first and second inverters 926, 928 are cross-coupled. The second inverter 930 is configured to invert a signal on the second inverter input node 932 to the output node (OUT) 918.

With continuing reference to FIG. 9, a supply switch circuit 934, which may be an NMOS head-switch transistor as shown, is coupled between the supply node 906 and the latch circuit 912 to supply the first and second inverters 926, 930 with a supply voltage Vdd. A reference switch circuit 936, which may be an NMOS foot-switch transistor as shown, is coupled between the sources (S) of the input and complement input transistors 902, 904, whose drains (D) are coupled to the latch circuit 912. The supply switch circuit 934 and the reference switch circuit 936 are enabled in response to the sense amplifier phase signal (SAE) 922, causing the latch circuit 912 to latch the data input voltage Vsa_data and the reference input voltage Vsa_ref, and generate the amplified data output voltage Vout on the output node (OUT) 918 and an amplified complement output voltage Voutb on the complement output node based (OUTB) 920 indicative of the sensed storage state of the resistive memory bitcell 306.

With continuing reference to FIG. 9, the OCZS-SA 900 also includes a data sense amplifier capacitor circuit (Csa_data) 938 and a reference sense amplifier capacitor circuit (Csa_ref) 940. The data sense amplifier capacitor circuit (Csa_data) 938 is configured to directly store the data input voltage Vsa_data from the sensing circuit 302 during a voltage capture phase. The reference sense amplifier capacitor circuit (Csa_ref) is configured to store the reference input voltage Vsa_ref from the sensing circuit 302 during a voltage capture phase. The data sense amplifier capacitor circuit (Csa_data) 938 and the reference sense amplifier capacitor circuit (Csa_ref) 940 may both include capacitors, which may be provided as transistors, such as PMOS transistors as shown. In this manner, the data input voltage Vsa_data and the reference input voltage Vsa_ref from the sensing circuit 302 can be provided to the input and complement input transistors 902, 904. The input transistor 902 includes the gate (G) coupled to the data sense amplifier capacitor circuit (Csa_data) 938. The input transistor 902 is configured to couple the input node 914 to a reference node 942 based on the data input voltage Vsa_data stored in the data sense amplifier capacitor circuit (Csa_data) 938, in response to the sense amplifier phase signal (SAE) 922. The complement input transistor 904 includes the gate (G) coupled to the reference sense amplifier capacitor circuit (Csa_ref) 940. The complement input transistor 904 is configured to couple a complement input node 916 to the reference node 942 based on the reference input voltage Vsa_ref stored in the reference sense amplifier capacitor circuit (Csa_ref) 940, in response to the sense amplifier phase signal (SAE) 922.

With continuing reference to FIG. 9, the OCZS-SA 900 also includes the reference switch circuit 936 coupled to the input transistor 902 and the complement input transistor 904. The reference switch circuit 936 is configured to adjust voltage at the gate (G) of the input transistor 902 to the input threshold voltage Vth of the input transistor 902, and the voltage at the gate (G) of the complement input transistor 904 to the complement input threshold voltage Vth of the complement input transistor 904, to cancel offset voltages of the input transistor 902 and the complement input transistor 904, in response to a discharge phase signal (P1) 944. The OCZS-SA 900 also includes a data input circuit 946, which may be a pass gate, coupled to the data sense amplifier capacitor circuit (Csa_data) 938. The data input circuit 946 is configured to pass the data input voltage Vsa_data directly to the data sense amplifier capacitor circuit (Csa_data) 938 in response to a first voltage capture phase signal (P2) 948. The OCZS-SA 900 also includes a reference input circuit 950, which may be a pass gate, coupled to the reference sense amplifier capacitor circuit (Csa_ref) 940. The reference input circuit 950 is configured to pass the reference input voltage Vsa_ref directly to the reference sense amplifier capacitor circuit (Csa_ref) 940 in response to a second voltage capture phase signal (P4) 952. As will be discussed in more detail below, the reference input circuit 950 is also configured to pass the data input voltage Vsa_data directly to the reference sense amplifier capacitor circuit (Csa_ref) 940 in response to the first voltage capture phase signal (P2) 948.

With continuing reference to FIG. 9, the OCZS-SA 900 also includes a pre-charge circuit 953 coupled to a pre-charge circuit 954 coupled to the gate (G) of the input transistor 902. The pre-charge circuit 953 may be provided as a PMOS transistor as shown in FIG. 9. The pre-charge circuit 954 may be provided in the form of a pass gate, as shown in FIG. 9. The pre-charge circuit 953 is configured to couple the supply voltage Vdd to the pre-charge circuit 954 in response to a pre-charge phase signal (PRE) 956. The pre-charge circuit 954 is configured to pre-charge the gate (G) of the input transistor 902 to the supply voltage Vdd on the supply node 906 in response to a pre-charge phase signal (PRE) 956 and the discharge phase signal (P1) 944. The OCZS-SA 900 also includes a complement pre-charge circuit 957 coupled to a complement pre-charge circuit 958 coupled to the gate (G) of the input transistor 902. The complement pre-charge circuit 957 may be provided as a PMOS transistor as shown in FIG. 9. The complement pre-charge circuit 958 may be provided in the form of a pass gate, as shown in FIG. 9. The complement pre-charge circuit 9537 is configured to couple the supply voltage Vdd to the complement pre-charge circuit 958 in response to a pre-charge phase signal (PRE) 956. The complement pre-charge circuit 958 is configured to pre-charge the gate (G) of the complement input transistor 904 to the supply voltage Vdd on the supply node 906 in response to the pre-charge phase signal (PRE) 956 and the discharge phase signal (P1) 944.

As will be discussed in more detail below, the pre-charging of the gate (G) of the input transistor 902 and complement input transistor 904 allows the input transistor 902 and complement input transistor 904 to be put in an activated state during sensing to avoid the zero-sensing dead zone. As will be discussed in more detail below, the pre-charging of the gate (G) of the input transistor 902 and complement input transistor 904 to the supply voltage Vdd also allows the voltage at the gates (G) of the input transistor 902 and complement input transistor 904 to be discharged in a discharge phase in response to the discharge phase signal (P1) 944 so that the threshold voltages Vth of the input transistor 902 and complement input transistor 904 cancel their offset voltages while still keeping the input transistor 902 and complement input transistor 904 in activated states to avoid the zero-sensing dead zone.

With continuing reference to FIG. 9, the OCZS-SA 900 also includes a discharge circuit 960 coupled between the data sense amplifier capacitor circuit (Csa_data) 938 and a ground node (GND). The discharge circuit 960 may be provided in the form of an NMOS transistor as shown in FIG. 9. The discharge circuit 960 is configured to discharge the data sense amplifier capacitor circuit (Csa_data) 938 to the ground node (GND) in response to the pre-charge phase signal (PRE) 956 and the discharge phase signal (P1) 944. Similarly, the OCZS-SA 900 also includes a complement discharge circuit 962 coupled between the reference sense amplifier capacitor circuit (Csa_ref) 940 and the ground node (GND). The complement discharge circuit 962 may be provided in the form of an NMOS transistor as shown in FIG. 9. The complement discharge circuit 962 is configured to discharge the reference sense amplifier capacitor circuit (Csa_ref) 940 to the ground node (GND) in response to the pre-charge phase signal (PRE) 956 and the discharge phase signal (P1) 944. With continuing reference to FIG. 9, the OCZS-SA 900 also includes a latch discharge circuit 964 coupled to the output node (OUT) 918. The latch discharge circuit 964 may be provided as an NMOS transistor, as shown. The latch discharge circuit 964 is configured to discharge the output node (OUT) 918 to the ground node (GND) in response to the pre-charge phase signal (PRE) 956 and the discharge phase signal (P1) 944. The OCZS-SA 900 also includes a complement latch discharge circuit 966 coupled to the complement output node (OUTB) 920. The complement latch discharge circuit 966 may be provided as an NMOS transistor, as shown. The complement latch discharge circuit 966 is configured to discharge the output node (OUT) 920 to the ground node (GND) in response to the pre-charge phase signal (PRE) 956 and the discharge phase signal (P1) 944.

With continuing reference to FIG. 9, the OCZS-SA 900 also includes a latch pre-charge circuit 970 coupled to the output node (OUT) 918, and a complement latch pre-charge circuit 972 coupled to the complement output node (OUTB) 920. The latch pre-charge circuit 970 is configured to pre-charge the output node (OUT) 918 to the supply voltage Vdd in response to the first voltage capture signal (P2) 948, the phase signal (P3) 968, and the second voltage capture signal (P4) 952. The complement latch pre-charge circuit 972 is configured to pre-charge the complement output node (OUTB) 920 to the supply voltage Vdd in response to the first voltage capture signal (P2) 948, the phase signal (P3) 968, and the second voltage capture signal (P4) 952. In this manner, both the output node (OUT) 918 and the complement output node (OUTB) 920 are pre-charged to prepare the latch circuit 912 to evaluate the differential voltage between the data input voltage Vsa_data and the reference input voltage Vsa_data in a sense amplifier phase in response to the sense amplifier phase signal (SAE) 922. With continuing reference to FIG. 9, the OCZS-SA 900 is responsive to a sequence of five (5) phase signals: the pre-charge phase signal (PRE) 956, the discharge phase signal (P1) 944, the first voltage capture phase signal (P2) 948, a phase signal (P3) 968, the second voltage capture phase signal (P4) 952, and the sense amplifier phase signal (SAE) 922 during a corresponding five (5) phases of operation. However, these five (5) phases can be performed for the same first and second sensing phases (SS1, SS2) as for example, the NOC-CLSA 600 in FIG. 6, such that there is no performance penalty over the NOC-CLSA 600. In the pre-charge phase indicated by the pre-charge phase signal (PRE) 956, nodes of the OCZS-SA 900 that are labeled PRE are energized. In the discharge phase indicated by discharge phase signal (P1) 944, nodes of the OCZS-SA 900 that are labeled P1 are energized. In the first voltage capture phase indicated by the first voltage capture phase signal (P2) 948, nodes of the OCZS-SA 900 that are labeled P2 are energized. In the phase indicated by phase signal (P3) 968, nodes of the OCZS-SA 900 that are labeled P3 are energized. In the second voltage capture phase indicated by second voltage capture phase signal (P4) 952, nodes of the OCZS-SA 900 that are labeled P4 are energized. Nodes of the OCZS-SA 900 that are labeled $\overline{PRE}$ are energized when nodes labeled PRE are not energized. Nodes of the OCZS-SA 900 that are labeled $\overline{P1}$, are energized when nodes labeled P1 are not energized. Nodes of the OCZS-SA 900 that are labeled $\overline{P2}$, are energized when nodes labeled P2 are not energized. Nodes of the OCZS-SA 900 that are labeled $\overline{P3}$, are energized when nodes labeled P3 are not energized. Nodes of the OCZS-SA 900 that are labeled $\overline{P4}$, are energized when nodes labeled P4 are not energized.

Figure 10:
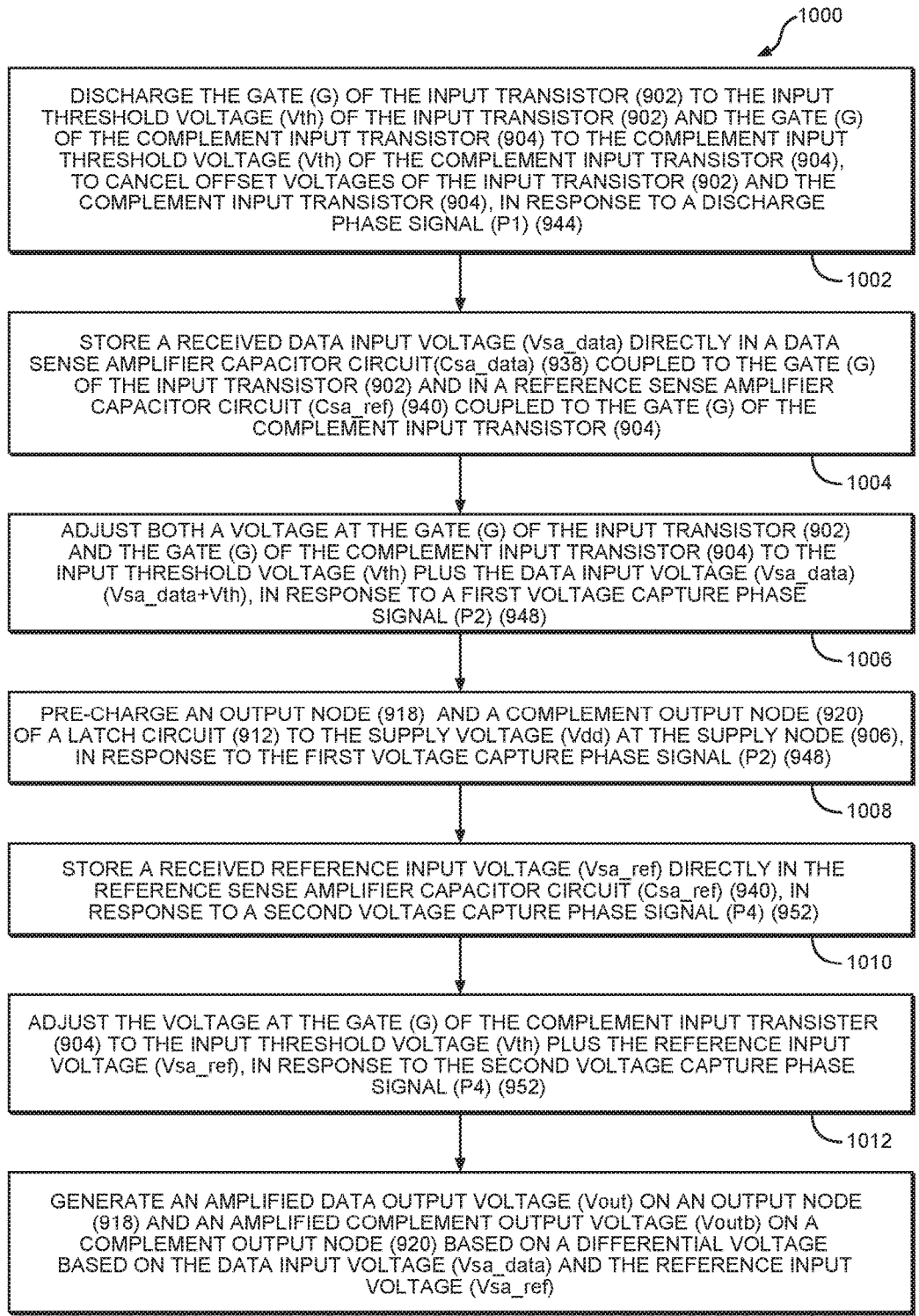
FIG. 10 is a flowchart illustrating the exemplary operational steps of the OCZS-SA in FIG. 9.

FIG. 10 is a flowchart illustrating an exemplary operational process 1000 of the OCZS-SA 900 in FIG. 9. The process 1000 in FIG. 10 will be discussed in conjunction with FIGS. 11A-11D. FIGS. 11A-11D illustrate different operational phases of the OCZS-SA 900 in FIG. 9 for sensing between data and reference input voltages Vsa_data, Vsa_ref as an indication of the storage state of the resistive memory bitcell 306 directly stored as data and reference input voltages Vsa_data, Vsa_ref from the sensing circuit 302 into the data and reference sense amplifier capacitors (Csa_data, Csa_ref) without the need for providing separate sense amplifier capacitors.

In this regard, as shown in FIG. 11A, in a pre-charge phase controlled by generation of the pre-charge phase signal (PRE) 956, the pre-charge circuit 954 and complement pre-charge circuit 958 are activated to pre-charge the gates (G) of the input transistor 902 and the complement input transistor 904 to the supply voltage Vdd. The pre-charge circuit 953 and the complement pre-charge circuit 957 are also activated to couple the supply voltage Vdd to the pre-charge circuit 954 and complement pre-charge circuit 958 in response to the pre-charge phase signal (PRE) 956. Then, as also shown in FIG. 11A, in a next discharge phase controlled by generation of the discharge phase signal (P1) 944, the gate (G) of the input transistor 902 is discharged to the input threshold voltage Vth1 of the input transistor 902, and the gate (G) of the complement input transistor 904 to the complement input threshold voltage Vth2 of the complement input transistor 904 (block 1002 in FIG. 10). This cancels the offset voltages of the input transistor 902 and the complement input transistor 904, in response to a discharge phase signal (P1) 944. This also keeps the input transistor 902 and the complement input transistor 904 activated to avoid a dead sensing zone during a later sensing phase.

Figure 11B:
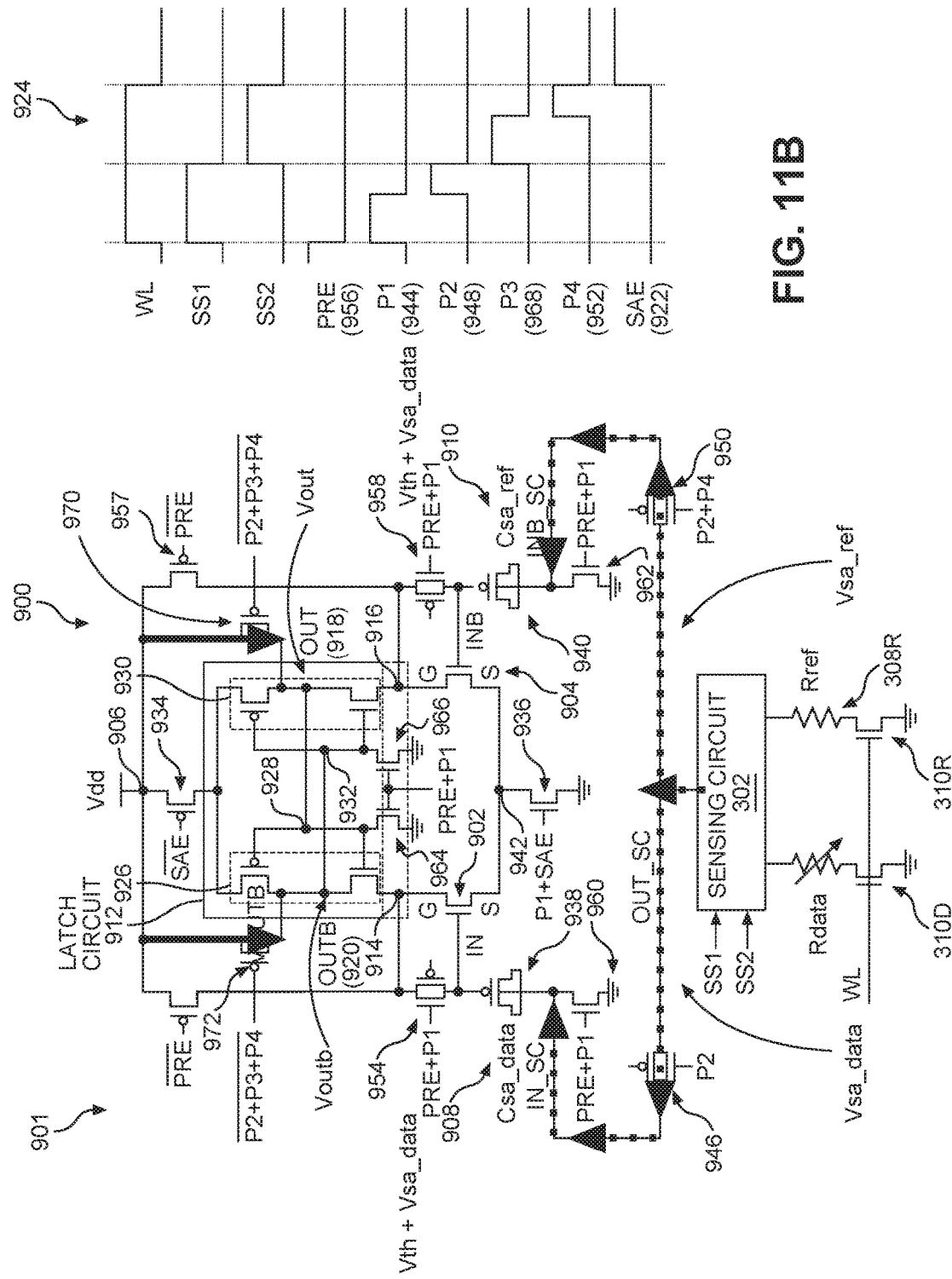

As next shown in FIG. 11B, in a first voltage capture phase controlled by the generation of the first voltage capture phase signal (P2) 948, the data input circuit 946 and reference input circuit 950 are activated (block 1004 in FIG. 10). This provides for the received data input voltage Vsa_data to be directly stored in the data sense amplifier capacitor circuit (Csa_data) 938 coupled to the gate (G) of the input transistor 902 (block 1004 in FIG. 10). The received data input voltage Vsa_data is also directly stored in the reference sense amplifier capacitor circuit (Csa_ref) 940 coupled to the gate (G) of the complement input transistor 904, because the received data input voltage Vsa_data is generated by the sensing circuit 302 during the first sensing phase (SS1). The stored received data input voltage Vsa_data in the data sense amplifier capacitor (Csa_data) 938 and the reference sense amplifier capacitor (Csa_ref) 940 causes the voltage at the gates (G) of the input transistor 902 and the complement input transistor 904 to be adjusted (i.e., added) to the threshold voltages (Vth1, Vth2) at the gates (G) to provide for the voltage at the gate (G) of the input transistor 902 to be Vth1+Vsa_data, and the voltage at the gate (G) of the complement input transistor 904 to be Vth2+Vsa_ref (block 1006 in FIG. 10). The output node (OUT) 918 and complement output node (OUTB) 920 of the latch circuit 912 are pre-charged to the supply voltage Vdd in preparation for the sensing phase (block 1008 in FIG. 10).

Thus, because the voltage at the gates (G) of both input transistor 902 and complement input transistor 904 are higher than their threshold voltages (Vth1, Vth2), there are no dead zone sensing issues. However, it is necessary to later provide for the received reference input voltage Vsa_ref to be stored in the reference sense amplifier capacitor circuit (Csa_ref) 940 to be provided to the gate (G) of the complement input transistor 904 for providing the latch circuit 912 to perform differential voltage comparison.

Also in response to the generation of the first voltage capture phase signal (P2) 948, the latch pre-charge circuit 970 and the complement latch pre-charge circuit 972 are activated to pre-charge the output node (OUT) 918 and the complement output node (OUTB) 920, respectively, to the supply voltage Vdd. In this manner, both the output node (OUT) 918 and the complement output node (OUTB) 920 are pre-charged to prepare the latch circuit 912 to evaluate the differential voltage between the data input voltage Vsa_data and the reference input voltage Vsa_data in a sense amplifier phase in response to the sense amplifier phase signal (SAE) 922.

Figure 11C:
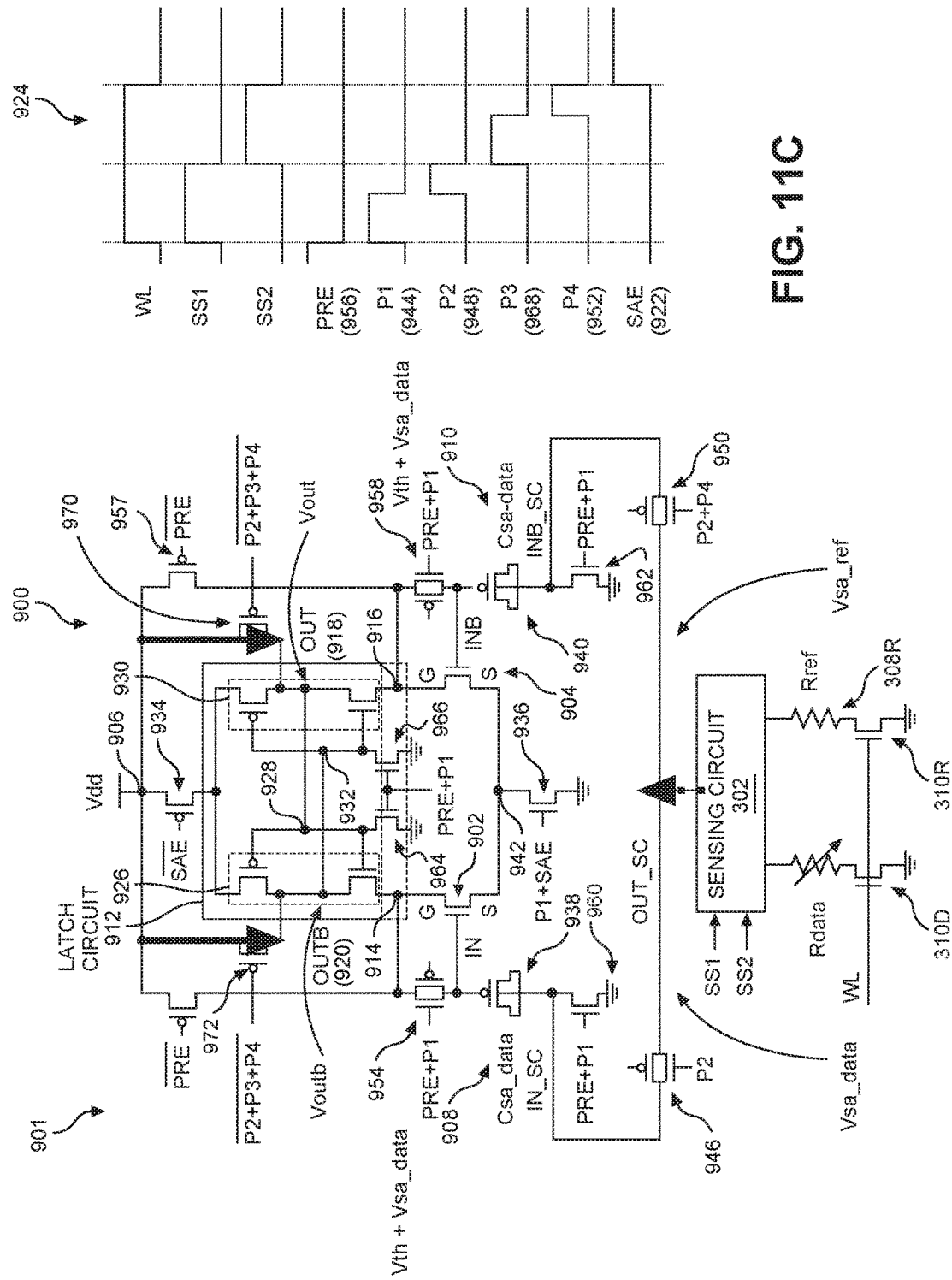

In this regard, in a next phase controlled by the generation of the phase signal (P3) 968 as shown in FIG. 11C, the OCZS-SA 900 waits for the reference input voltage Vsa_ref to be generated by the sensing circuit 302 in the second sensing phase (SS2) and received. The output node (OUT) 918 and complement output node (OUTB) 920 of the latch circuit 912 continue to be pre-charged to the supply voltage Vdd in preparation for the sensing phase. Also in response to the generation of the phase signal (P3) 968, the latch pre-charge circuit 970 and the complement latch pre-charge circuit 972 continue to be activated to pre-charge the output node (OUT) 918 and the complement output node (OUTB) 920, respectively, to the supply voltage Vdd.

Figure 11D:
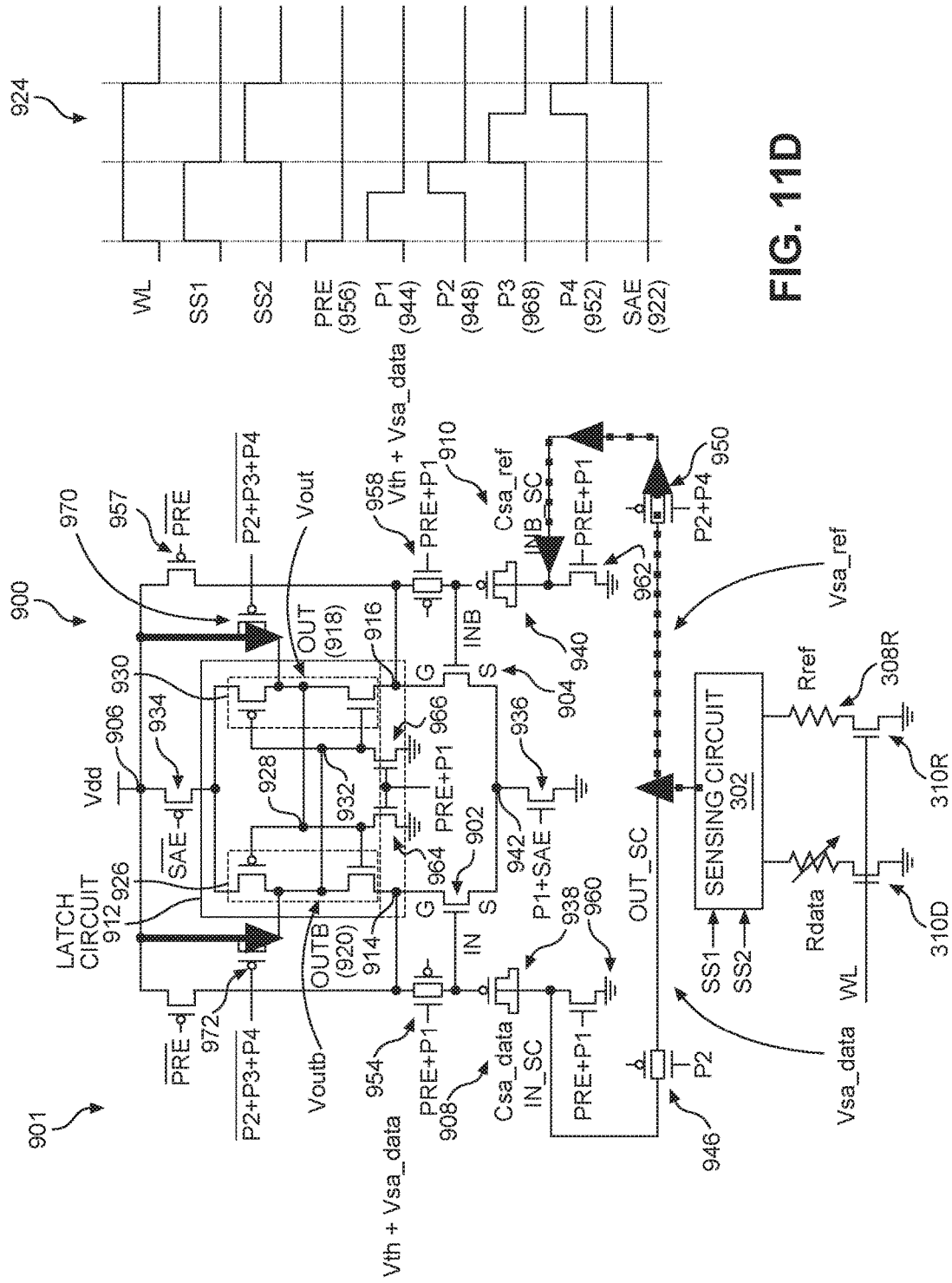

Next, in a second voltage capture phase controlled by the generation of the second voltage capture phase signal (P4) 952 as shown in FIG. 11D, the reference input circuit 950 is activated. This provides for the received reference input voltage Vsa_ref to be directly stored in the reference sense amplifier capacitor circuit (Csa_ref) 940 coupled to the gate (G) of the complement input transistor 904 (block 1010 in FIG. 10). The stored received reference input voltage Vsa_ref in the reference sense amplifier capacitor circuit (Csa_ref) 940 causes the voltage at the gate (G) of the complement input transistor 904 to be adjusted (i.e., added) to the threshold voltages Vth2 at the gate (G) to provide for the voltage at the gate (G) of the complement input transistor 902 to be Vth2+Vsa_ref (block 1012 in FIG. 10). The output node (OUT) 918 and complement output node (OUTB) 920 of the latch circuit 912 continue to be pre-charged to the supply voltage Vdd in preparation for the sensing phase. Also in response to the generation of the second voltage capture phase signal (P4) 952, the latch pre-charge circuit 970 and the complement latch pre-charge circuit 972 continue to be activated to pre-charge the output node (OUT) 918 and the complement output node (OUTB) 920, respectively, to the supply voltage Vdd.

Thereafter, in a sensing phase controlled by the generation of the sense amplifier phase signal (SAE) 922, the latch circuit 912 is configured to generate the amplified data output voltage (Vout) on the output node (OUT) 918 and the amplified complement output voltage (Voutb) on the complement output node (OUTB) 920 based on a differential voltage based on the data input voltage Vsa_data and the reference input voltage Vsa_ref (block 1014 in FIG. 10). Either of the amplified data output voltage (Vout) on the output node (OUT) 918 or the amplified complement output voltage (VOUTB) on the complement output node (OUTB) 920 can be provided to another circuit to indicate the sensed storage state of the resistive memory bitcell 306.

Figure 12A:
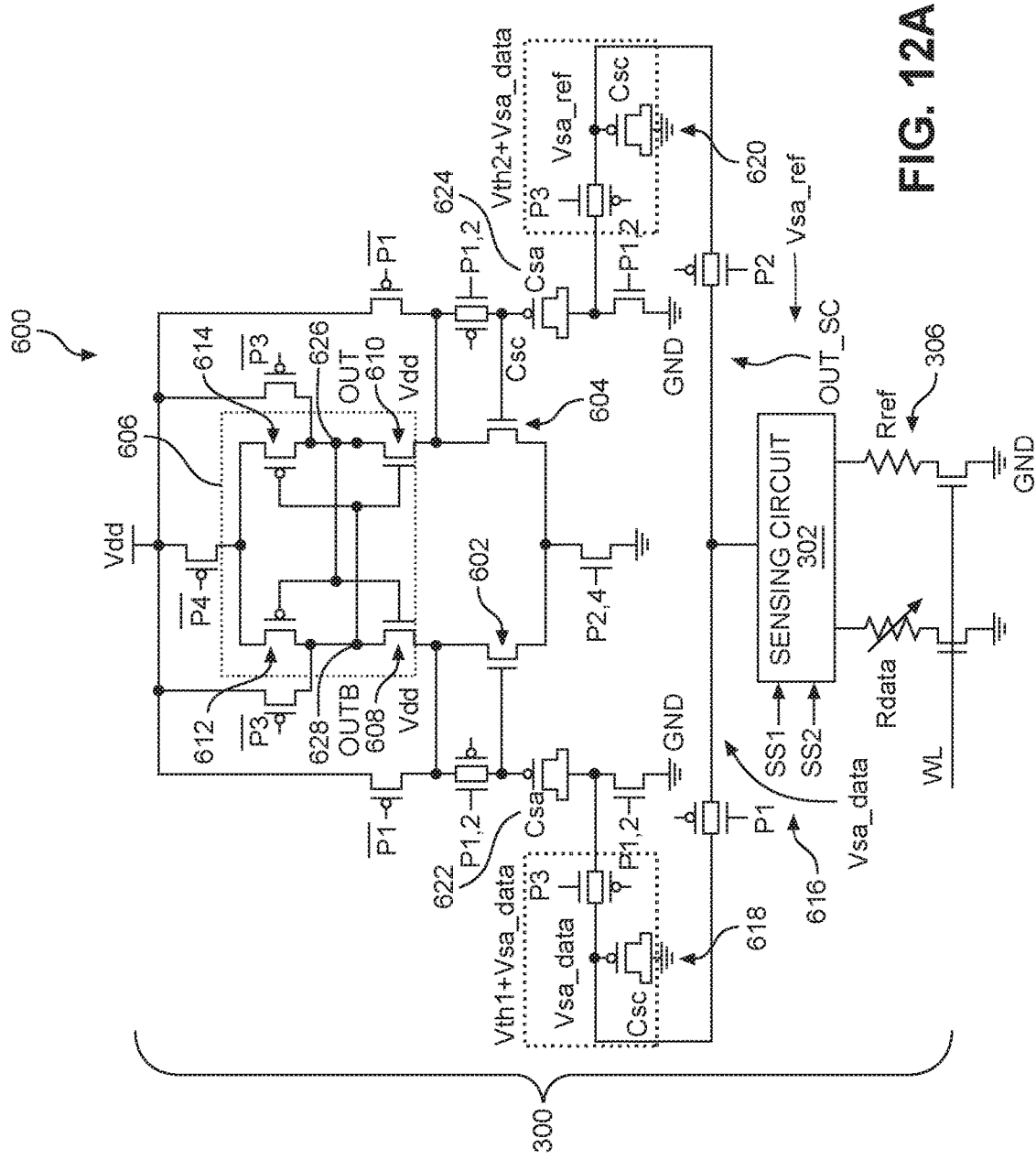
FIGS. 12A and 12B are respective schematic diagrams of the sensing systems in FIG. 6 and FIG. 9 to illustrate the exemplary circuit differences between the NOC-CLSA and OCZS-SA provided therein.
Figure 12B:
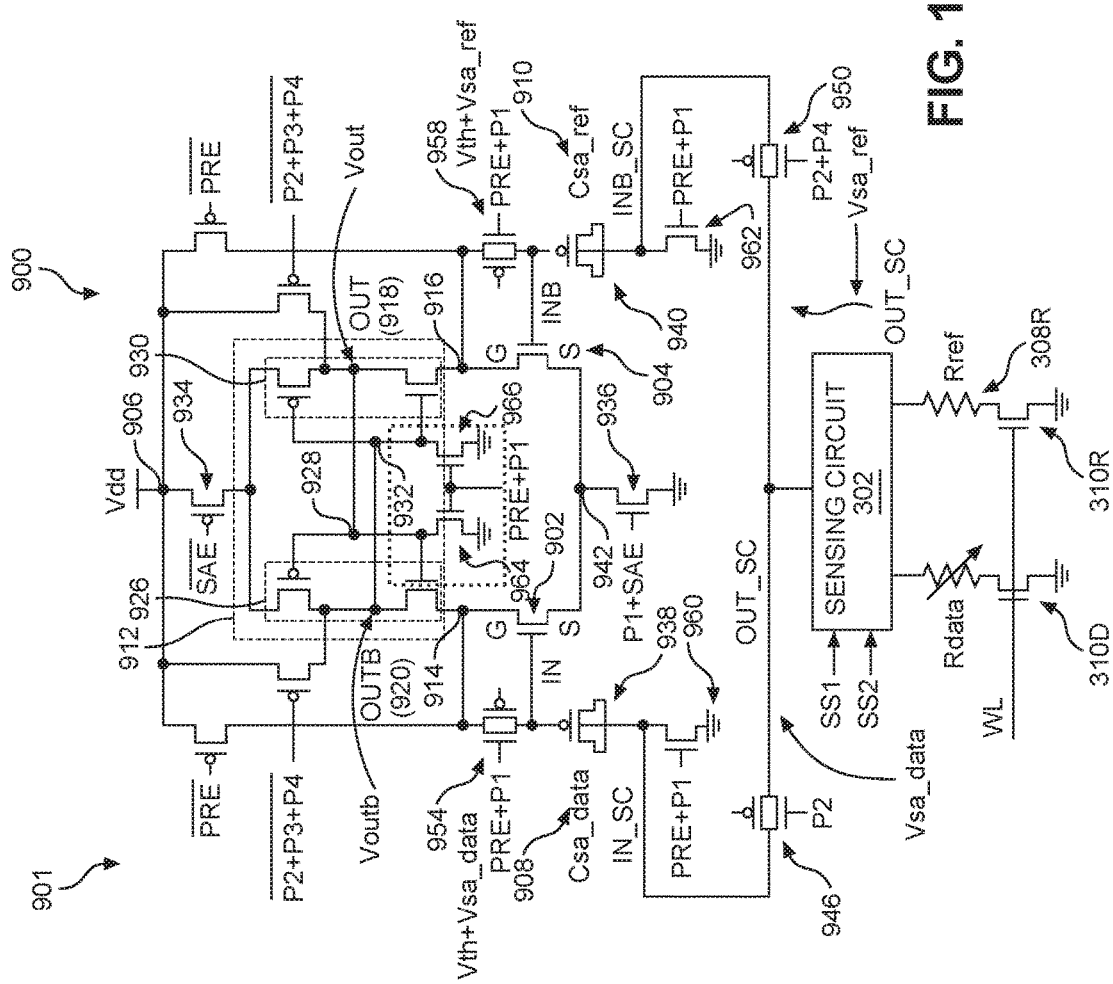

This, for exemplary comparison purposes only, FIG. 12A illustrates the NOC-CLSA 600 in FIG. 6 beside the OCZS-SA 900 in FIG. 12B. As shown therein, the NOC-CLSA 600 includes the isolated sensing capacitor circuits (Csc) 618, 620, which are not provided in the OCZS-SA 900. The latch discharge circuit 964 and complement latch discharge circuit 966 are provided and coupled to the output node (OUT) 918 and the complement output node (OUTB) 920, respectively, to discharge the output node (OUT) 918 and the complement output node (OUTB) 920 to the ground node (GND) during the pre-charge phase and the discharge phase signal (P1) 944. Nevertheless, the layout area of the OCZS-SA 900 is substantially less than the layout area of the NOC-CLSA 600, as shown in FIGS. 13A and 13B. FIG. 13A illustrates an exemplary layout of the NOC-CLSA 600. FIG. 13B illustrates an exemplary layout of the OCZS-SA 900. Only the data and reference sense amplifier capacitors (Csa_data, Csa_ref) 908, 910 are included in the OCZS-SA 900. Further, data and reference sense amplifier capacitors (Csa_data, Csa_ref) 908, 910 can be smaller than the data and reference sense amplifier capacitors (Csa_data, Csa_ref) 622, 624 in the layout of the NOC-CLSA 600. As shown in a graph 1400 in FIG. 14, the standard deviation of an offset variation of the NOC-CLSA 600 in FIG. 6 and the OCZS-SA 900 in FIG. 9 is a function of the width of the respective sense amplifier capacitors provided therein.

Figure 14:
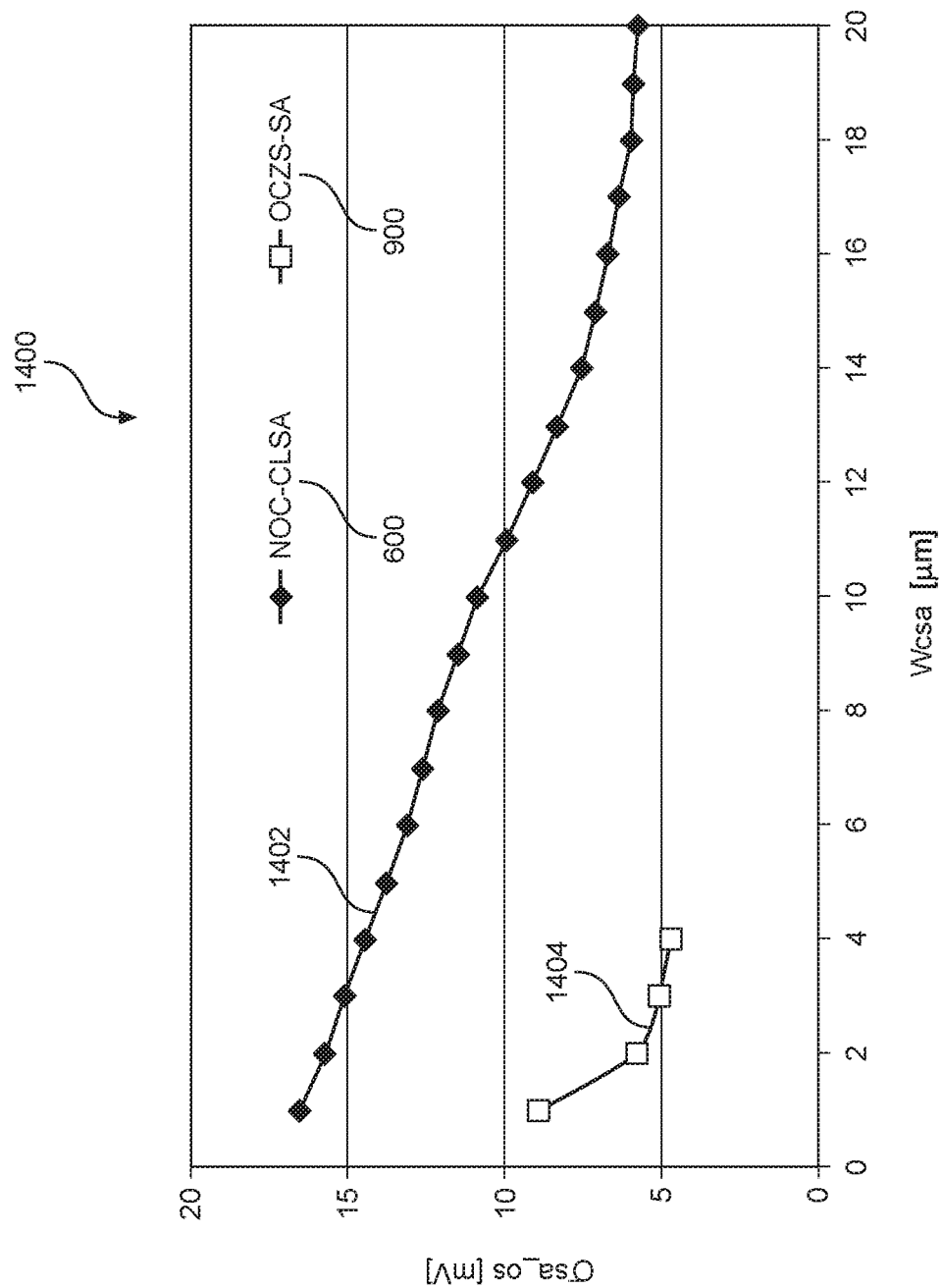
FIG. 14 is a graph illustrating a standard deviation of an offset variation of the NOC-CLSA in FIG. 6 and the OCZS-SA in FIG. 9 as a function of a width of the sense amplifier capacitors provided therein.

With reference to FIG. 14, line 1402 shows an exemplary standard deviation of an offset variation of the NOC-CLSA 600 in FIG. 6 for a given width size of the data and reference sense amplifier capacitors (Csa_data, Csa_ref) 622, 624. Line 1404 shows an exemplary standard deviation of an offset variation of the OCZS-SA 900 in FIG. 9 for a given width size of the data and reference sense amplifier capacitors (Csa_data, Csa_ref) 908, 910. For example, for a capacitor width of one (1) micrometers (μm), the offset voltage variation between the data input voltage Vsa_data on the input node 914 and the reference input voltage Vsa_ref on the complement input node 916 may be different by more than approximately 6-7 milliVolts (mV). Thus, as shown in FIG. 14, a capacitor width of the data and reference sense amplifier capacitors (Csa_data, Csa_ref) 622, 624 in the NOC-CLSA 600 may be twenty (20) μm to achieve the same offset voltage variation as can be provided in the OCZS-SA 900 in FIG. 9 using data and reference sense amplifier capacitors (Csa_data, Csa_ref) 908, 910 having an approximate width of two (2) μm. In this regard, the width of the data and reference sense amplifier capacitors (Csa_data, Csa_ref) 908, 910 provided in the OCZS-SA 900 may each be provided between approximately one (1) and five (5) μm as an example. As another example, the offset voltage variation between the data input voltage Vsa_data on the input node 914 and the reference input voltage Vsa_ref on the complement input node 916 may be approximately four (4) and nine (9) milliVolts (mV).

Figure 15:
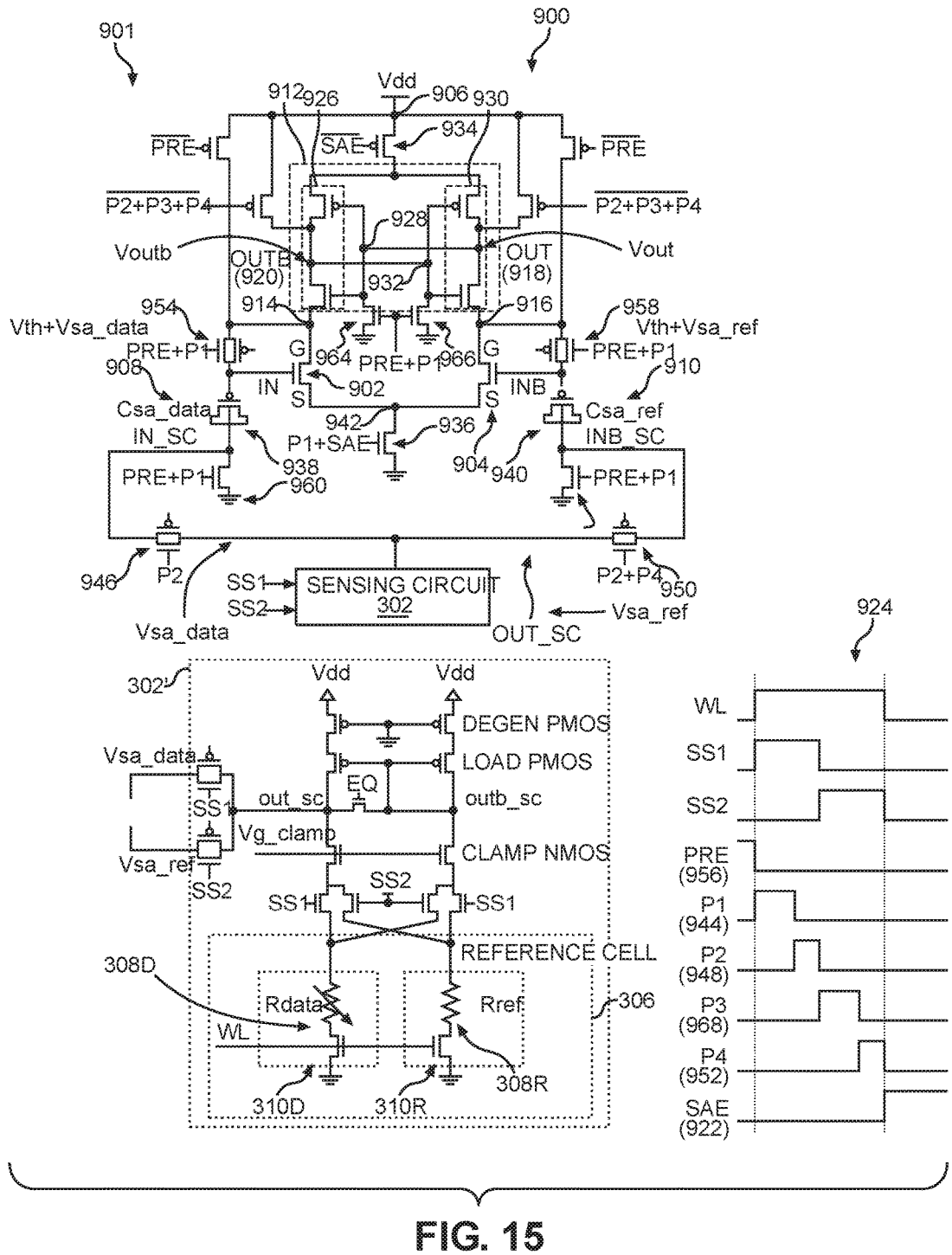
FIG. 15 is an exemplary sensing system for sensing a storage state of a resistive memory bitcell, wherein the sensing system includes an offset-cancelling (OC) dual-stage (DS) (OCDS) sensing circuit (SC) (OCDS-SC) configured to provide data and reference input voltages representing the storage state of the resistive memory bitcell in the OCZS-SA in FIG. 9.

FIG. 15 is an exemplary sensing system 300' for sensing the storage state of a resistive memory bitcell 306, wherein the sensing system 300' includes an offset-cancelling (OC) dual-stage (DS) (OCDS) sensing circuit (SC) (OCDS-SC) 302' as provided in U.S. Pat. No. 9,165,630 to provide the data and reference input voltages Vsa_data, Vsa_ref, representing the storage state of a resistive memory bitcell 306 to the OCZS-SA 900. As shown in FIG. 15, the OCDS-SC 302' includes a data current path 1502 and a reference current path 1504. The data current path 1502 includes a data path degeneration PMOS (PDd), a data path load PMOS (PLd), a data path first stage switching transistor 1506 and a data path clamp NMOS (NCd) coupled to a data resistive memory element Rdata of the resistive memory bitcell 306. A sensing circuit output node 1508 is located between the data path load PMOS (PLd) and the data path clamp NMOS (NCd). The reference current path 1504 includes a reference path degeneration PMOS (PDr), a reference path load PMOS (PLr), a reference path first stage switching transistor 1510 and a reference path clamp NMOS (NCr) coupled to a reference resistive memory element Rref of the resistive memory bitcell 306.

An adjustable load PMOS gate node 1512 is located between the reference path load PMOS (PLr) and the reference path clamp NMOS (NCr). The adjustable load PMOS gate node 1512 is coupled to the gate (G) of the data path load PMOS (PLd) and the gate (G) of the reference path load PMOS (PLr). An equalization transistor 1514 is coupled between a sensing circuit output node 1516 and the adjustable load PMOS gate node 1512. A data path second stage switching transistor 1518 is coupled between the data path clamp NMOS (NCd) and the reference resistive memory element Rref. A reference path second stage switching transistor 1520 is coupled between the reference path clamp NMOS (NCr) and the data resistive memory element Rdata.

In a first operating stage of the OCDS-SC 302', a first stage enable signal (SS1) is on and a second stage enable signal (SS2) is off. The first stage enable signal (SS1) turns on the data path first stage switching transistor 1506 and the reference path first stage switching transistor 1510. Early in the first operating stage, an equalization signal (EQ) to the equalization transistor 1514 becomes high. The data current path 1502 is charged rapidly by equalizing an output ($V_{OUT\_SC}$) at the sensing circuit output node 1516 and a load PMOS gate voltage ($V_{G\_load}$) at the adjustable load PMOS gate node 1512. This equalization leads to an improvement in sensing speed. Later in the first operating stage, the equalization signal (EQ) becomes low, which decouples the sensing circuit output node 1516 and the adjustable load PMOS gate node 1512. Thus, during the first operating stage, $V_{G\_load\_1st}$ is generated based on $R_{ref}$ and $V_{SA\_data}$ is generated by using $R_{data}$ and $V_{G\_load\_1st}$.

In a second operating stage of the OCDS-SC 302', the first stage enable signal (SS1) is off and the second stage enable signal (SS2) is on. The second stage enable signal (SS2) turns on the data path second stage switching transistor 1518 and a reference path second stage switching transistor 1520. Early in the second operating stage, an equalization signal (EQ) becomes high so $V_{OUT\_SC}$ resets to $V_{G\_load}$. This equalization leads to an improvement in sensing speed. Later in the second operating stage, the equalization signal (EQ) becomes low which decouples the sensing circuit output node 1516 from the adjustable load PMOS gate node 1512. Thus, during the second operating stage, $V_{G\_load\_2nd}$ is generated based on $R_{data}$, and $V_{SA\_REF}$ is generated based on $R_{ref}$ and $V_{G\_load\_2nd}$.

The OCDS-SC 302' generates both the data input voltage Vsa_data and the reference input voltage Vsa_ref at the same node, i.e. the sensing circuit output node 1516. This provides offset cancellation, which improves tolerance of process variations. According to another example, the adjustable load PMOS gate voltages $V_{G\_load\_1st}$ and $V_{G\_load\_2nd}$ provide a doubled sensing margin.

An OCZS-SA configured to directly store the data input voltage and reference input voltage from the sensing circuit into sense amplifier capacitors without the need for providing separate sense amplifier capacitors, including without limitation the OCZS-SA 900 in FIG. 9, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 16:
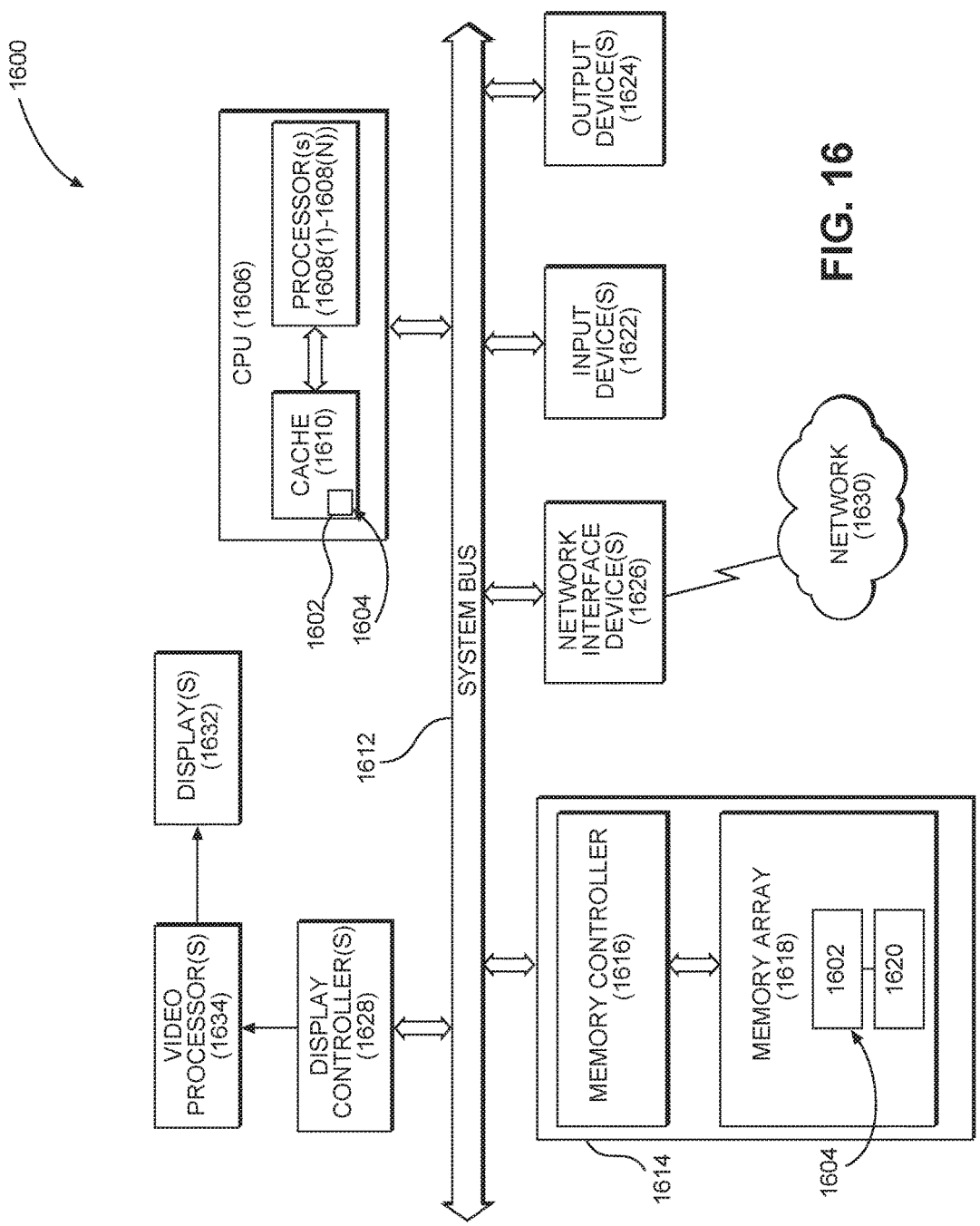
FIG. 16 is a block diagram of an exemplary processor-based system that can include an OCZS-SA configured to directly store the data input voltages and reference input voltages from a sensing circuit into sense amplifier capacitors without the need for providing separate sense amplifier capacitors, including without limitation the OCZS-SA in FIG. 9.

In this regard, FIG. 16 illustrates an example of a processor-based system 1600 that can include a sensing system 1602 including an OCZS-SA 1604 configured to directly store the data input voltage and reference input voltage from a sensing circuit into sense amplifier capacitors without the need for providing separate sense amplifier capacitors, including without limitation the OCZS-SA 900 in FIG. 9. The OCZS-SA 1604 can be provided in any of the components in the processor-based system 1600. In this example, the processor-based system 1600 includes a CPU 1606 that includes one or more processors 1608(1)-1608(N). The CPU 1606 may have shared cache memory 1610 accessible by the CPU(s) 1608(1)-1608(N) for rapid access to temporarily stored data. As one example, the sensing system 1602 with the OCZS-SA 1604 may be included in the cache memory 1610 for sensing a storage state of memory bitcells in the cache memory 1610.

The CPU 1606 is coupled to a system bus 1612 and can intercouple master and slave devices included in the processor-based system 1600. As is well known, the CPU 1606 communicates with these other devices by exchanging address, control, and data information over the system bus 1612. Although not illustrated in FIG. 16, multiple system buses 1612 could be provided, wherein each system bus 1612 constitutes a different fabric. For example, the CPU 1606 can communicate bus transaction requests to a memory system 1614 as an example of a slave device. The memory system 1614 may include a memory controller 1616 that controls access to a memory array 1618. The memory array 1618 may include resistive memory bitcells 1620 and a sensing system 1602 including an OCZS-SA 1604 for sensing the storage state of memory bitcells in the memory array 1618. Thus, the memory system 1614 may be an MRAM is an example.

Other master and slave devices can be connected to the system bus 1612. As illustrated in FIG. 16, these devices can include the memory system 1614, one or more input devices 1622, one or more output devices 1624, one or more network interface devices 1626, and one or more display controllers 1628. The input device(s) 1622 can include any type of input device, including but not limited to input keys, switches, voice processors, etc. The output device(s) 1624 can include any type of output device, including but not limited to audio, video, other visual indicators, etc. The network interface device(s) 1626 can be any devices configured to allow exchange of data to and from a network 1630. The network 1630 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1626 can be configured to support any type of communications protocol desired.

The CPU 1606 may also be configured to access the display controller(s) 1628 over the system bus 1612 to control information sent to one or more displays 1632. The display controller(s) 1628 sends information to the display(s) 1632 to be displayed via one or more video processors 1634, which process the information to be displayed into a format suitable for the display(s) 1632. The display(s) 1632 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable (G)ate Array (FP(G)A) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A sense amplifier, comprising:
   a latch circuit, comprising:
      an input node configured to receive a data input voltage; and
      a complement input node configured to receive a reference input voltage;
      the latch circuit configured to generate an amplified data output voltage on an output node and an amplified complement output voltage on a complement output node based on a differential voltage based on the data input voltage and the reference input voltage, in response to a sense amplifier phase signal;
   a data sense amplifier capacitor circuit configured to store the data input voltage from a sensing circuit;
   a reference sense amplifier capacitor circuit configured to store the reference input voltage from the sensing circuit;
   an input transistor comprising a gate coupled to the data sense amplifier capacitor circuit, the input transistor configured to couple the input node to a reference node based on the data input voltage stored in the data sense amplifier capacitor circuit, in response to the sense amplifier phase signal;
   a complement input transistor comprising a gate coupled to the reference sense amplifier capacitor circuit, the complement input transistor configured to couple the complement input node to the reference node based on the reference input voltage in the reference sense amplifier capacitor circuit, in response to the sense amplifier phase signal;
   a reference switch circuit coupled to the input transistor and the complement input transistor, the reference switch circuit configured to adjust a voltage at the gate of the input transistor to an input threshold voltage of the input transistor, and a voltage at the gate of the complement input transistor to a complement input threshold voltage of the complement input transistor, to cancel offset voltages of the input transistor and the complement input transistor, in response to a discharge phase signal;
   a data input circuit coupled to the data sense amplifier capacitor circuit, the data input circuit configured to pass the data input voltage directly to the data sense amplifier capacitor circuit in response to a first voltage capture phase signal; and
   a reference input circuit coupled to the reference sense amplifier capacitor circuit, the reference input circuit configured to pass the reference input voltage directly to the reference sense amplifier capacitor circuit in response to a second voltage capture phase signal.

2. The sense amplifier of claim 1, wherein no additional capacitor is coupled between the data input circuit and the data sense amplifier capacitor circuit, and no additional capacitor is coupled between the reference input circuit and the reference sense amplifier capacitor circuit.

3. The sense amplifier of claim 1 configured to receive the second voltage capture phase signal after the first voltage capture phase signal.

4. The sense amplifier of claim 1, further comprising:
   a pre-charge circuit coupled to the gate of the input transistor, the pre-charge circuit configured to pre-charge the gate of the input transistor to a supply voltage on a supply node in response to a pre-charge phase signal; and
   a complement pre-charge circuit coupled to the gate of the complement input transistor, the complement pre-charge circuit configured to pre-charge the gate of the complement input transistor to the supply voltage on the supply node in response to the pre-charge phase signal.

5. The sense amplifier of claim 4, wherein:
   the pre-charge circuit comprises a pass gate configured to couple the gate of the input transistor to the supply voltage on the supply node in response to the pre-charge phase signal; and
   the complement pre-charge circuit comprises a pass gate configured to couple the gate of the complement input transistor to the supply voltage on the supply node in response to the pre-charge phase signal.

6. The sense amplifier of claim 1, further comprising:
   a discharge circuit coupled between the data sense amplifier capacitor circuit and a ground node, the discharge circuit configured to discharge the data sense amplifier capacitor circuit to the ground node in response to a pre-charge phase signal and the discharge phase signal; and a complement discharge circuit coupled between the reference sense amplifier capacitor circuit and the ground node, the complement discharge circuit configured to discharge the reference sense amplifier capacitor circuit to the ground node in response to the pre-charge phase signal and the discharge phase signal.

7. The sense amplifier of claim 1, further comprising:
a latch discharge circuit coupled to the output node, the latch discharge circuit configured to discharge the output node to the ground node in response to a pre-charge phase signal and the discharge phase signal; and
a complement latch discharge circuit coupled to the complement output node, the complement latch discharge circuit configured to discharge the complement output node to the ground node in response to the pre-charge phase signal and the discharge phase signal.

8. The sense amplifier of claim 1, further comprising:
a latch pre-charge circuit coupled to the output node, the latch pre-charge circuit configured to pre-charge the output node to a supply voltage in response to the first voltage capture signal and the second voltage capture signal; and
a complement latch pre-charge circuit coupled to the complement output node, the complement latch pre-charge circuit configured to pre-charge the complement output node to the supply voltage in response to the first voltage capture signal and the second voltage capture signal.

9. The sense amplifier of claim 1, further comprising a supply switch circuit coupled between a supply node and the latch circuit, the supply switch circuit configured to couple the supply voltage to the latch circuit, in response to the sense amplifier phase signal.

10. The sense amplifier of claim 9, wherein the reference switch circuit is further configured to couple the input transistor and the complement input transistor to the reference node, in response to the sense amplifier phase signal.

11. The sense amplifier of claim 1, wherein:
the data sense amplifier capacitor circuit comprises a data sense amplifier capacitor; and
the reference sense amplifier capacitor circuit comprises a reference sense amplifier capacitor.

12. The sense amplifier of claim 11, wherein:
the data sense amplifier capacitor has a width between approximately one (1) and five (5) micrometers (μm); and
the reference sense amplifier capacitor has a width between approximately one (1) and five (5) micrometers (μm).

13. The sense amplifier of claim 1 configured to provide an offset voltage variation between the data input voltage on the input node and the reference input voltage on the complement input node of approximately four (4) and nine (9) milliVolts (mV).

14. The sense amplifier of claim 1, wherein:
the input transistor comprises an N-type metal-oxide semiconductor (MOS) (NMOS) transistor; and
the complement input transistor comprises an NMOS transistor.

15. The sense amplifier of claim 1, wherein the latch circuit further comprises:
a first inverter comprising a first inverter input node and the complement output node, the first inverter configured to invert a signal on the first inverter input node to the complement output node; and
a second inverter comprising a second inverter input node and the output node, the second inverter configured to invert a signal on the second inverter input node to the output node;

the output node coupled to the second inverter input node; and
the complement output node coupled to the inverter input node.

16. The sense amplifier of claim 1 integrated into an integrated circuit (IC).

17. The sense amplifier of claim 1 integrated into a device selected from the group consisting of: a set top box; data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

18. A sense amplifier, comprising:
a latching means, comprising:
a means for receiving a data input voltage; and
a means for receiving a reference input voltage;
a means for generating an amplified data output voltage on an output node and an amplified complement output voltage on a complement output node based on a differential voltage based on the data input voltage and the reference input voltage, in response to a sense amplifier phase signal;
a means for storing the data input voltage from a sensing circuit;
a means for storing the reference input voltage from the sensing circuit;
an input means coupled to the means for storing the data input voltage, the input means for coupling the means for receiving the data input voltage to a reference node based on the data input voltage stored in the means for storing the data input voltage;
a complement input means coupled to the means for storing the reference input voltage, the complement input means for comprising a gate coupled to the reference sense amplifier capacitor circuit, the complement input means for coupling the means for receiving the reference input voltage to the reference node based on the reference input voltage stored in the means for storing the reference input voltage;
a means for discharging coupled to the input means and the complement input means, for discharging the input means and discharging the complement input means to cancel offset voltages of the input means and the complement input means, in response to a discharge phase signal;
a data input means coupled to the means for storing the data input voltage, for passing the data input voltage directly to the means for storing the data input voltage in response to a voltage capture phase signal; and
a reference input means coupled to the means for storing the reference input voltage, for passing the reference input voltage directly to the means for storing the reference input voltage in response to the voltage capture phase signal.

19. The sense amplifier of claim 18, further comprising:
a means for pre-charging coupled to the input means, for pre-charging the input means to a supply voltage on a supply node in response to a pre-charge phase signal; and
a complement means for pre-charging coupled to the complement input means, for pre-charging the complement input means to the supply voltage on the supply node in response to the pre-charge phase signal.

20. A method of sensing a differential voltage of a data input voltage and a reference input voltage, comprising:

discharging a gate of an input transistor to an input threshold voltage of the input transistor and a gate of a complement input transistor to a complement input threshold voltage of the complement input transistor, to cancel offset voltages of the input transistor and the complement input transistor, in response to a discharge phase signal;

storing a received data input voltage directly in a data sense amplifier capacitor coupled to the gate of the input transistor and in a reference sense amplifier capacitor coupled to the gate of the complement input transistor;

adjusting both a voltage at the gate of the input transistor and the gate of the complement input transistor to the input threshold voltage plus the data input voltage, in response to a first voltage capture phase signal;

pre-charging an output node and a complement output node of a latch circuit to a supply voltage at a supply node, in response to the first voltage capture phase signal;

storing a received reference input voltage directly in the reference sense amplifier capacitor, in response to a second voltage capture phase signal;

adjusting the voltage at the gate of the complement input transistor to the input threshold voltage plus the reference input voltage, in response to the second voltage capture phase signal; and generating an amplified data output voltage on an output node and an amplified complement output voltage on a complement output node based on a differential voltage based on the data input voltage and the reference input voltage.

21. The method of claim 20, further comprising not storing the data input voltage and the reference input voltage in another capacitor circuit.

22. The method of claim 20, comprising receiving the second voltage capture phase signal after receiving the first voltage capture phase signal.

23. The method of claim 20, further comprising pre-charging the gate of the input transistor and the gate of the complement input transistor to the supply voltage from the supply node in response to a pre-charge phase signal.

24. The method of claim 20, further comprising pre-charging the output node and the complement output node of the latch circuit to the supply voltage at the supply node, in response to a sense amplifier phase signal.

25. The method of claim 23, further comprising:
discharging the data sense amplifier capacitor to a ground node in response to the pre-charge phase signal and the discharge phase signal; and
discharging the reference sense amplifier capacitor to the ground node in response to the pre-charge phase signal and the discharge phase signal.

26. The method of claim 23, further comprising:
discharging the output node to a reference node in response to the pre-charge phase signal and the discharge phase signal; and
discharging the complement output node to the reference node in response to the pre-charge phase signal and the discharge phase signal.

27. The method of claim 23, further comprising:
pre-charging the output node to the supply voltage in response to the first voltage capture signal and the second voltage capture signal; and
pre-charging the complement output node to the supply voltage in response to the first voltage capture signal and the second voltage capture signal.

28. The method of claim 20, further comprising coupling the supply voltage to the latch circuit and coupling the input transistor and the complement input transistor to a reference node, in response to a sense amplifier phase signal.

29. A resistive memory sensing system, comprising:
a memory array comprising a plurality of resistive memory bitcells each comprising a data resistive memory element and a reference resistive memory element, a storage state of each of the plurality of resistive memory bitcells based on a differential resistance between the data resistive memory element and the reference resistive memory element;

a sensing circuit coupled to the memory array, the sensing circuit configured to:
select a resistive memory bitcell among the plurality of resistive memory bitcells in response to a read operation;
generate a data input voltage based on a resistance of the data resistive memory element of the selected resistive memory bitcell; and
generate a reference input voltage based on a resistance of the reference resistive memory element of the selected resistive memory bitcell; and a sense amplifier configured to:
discharge a gate of an input transistor to an input threshold voltage of the input transistor and a gate of a complement input transistor to a complement input threshold voltage of the complement input transistor, to cancel offset voltages of the input transistor and the complement input transistor, in response to a discharge phase signal;
store the data input voltage from the sensing circuit directly in a data sense amplifier capacitor coupled to the gate of the input transistor and in a reference sense amplifier capacitor coupled to the gate of the complement input transistor;
adjust both a voltage at the gate of the input transistor and the gate of the complement input transistor to the input threshold voltage plus the data input voltage, in response to a voltage capture phase signal;
pre-charge an output node and a complement output node of a latch circuit to a supply voltage at a supply node, in response to a first voltage capture phase signal;
store the reference input voltage received from the sensing circuit directly in the reference sense amplifier capacitor, in response to a second voltage capture phase signal;
adjust the voltage at the gate of the complement input transistor to the input threshold voltage plus the reference input voltage, in response to the second voltage capture phase signal; and
generate an amplified data output voltage on the output node and an amplified complement output voltage on the complement output node based on a differential voltage based on the data input voltage and the reference input voltage.

30. The resistive memory sensing system of claim 29, wherein the plurality of resistive memory bitcells each comprises the data resistive memory element comprising a data magnetic tunnel junction (MTJ) device and the reference resistive memory element comprising a reference MTJ device.

* * * * *